(12) United States Patent
Peng et al.

(10) Patent No.: US 10,779,100 B2
(45) Date of Patent: Sep. 15, 2020

(54) METHOD FOR MANUFACTURING A MICROPHONE

(71) Applicant: Taiwan Semiconductor Manufacturing Company, Ltd., Hsin-Chu (TW)

(72) Inventors: Jung-Huei Peng, Jhubei (TW); Chia-Hua Chu, Zhubei (TW); Chun-wen Cheng, Zhubei (TW); Chin-Yi Cho, Kaohsiung (TW); Li-Min Hung, Longtan Townshiip (TW); Yao-Te Huang, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 184 days.

(21) Appl. No.: 16/001,032

(22) Filed: Jun. 6, 2018

(65) Prior Publication Data

US 2018/0288549 A1 Oct. 4, 2018

Related U.S. Application Data

(62) Division of application No. 15/018,625, filed on Feb. 8, 2016, now Pat. No. 9,998,843, which is a division
(Continued)

(51) Int. Cl.
*H04R 31/00* (2006.01)
*B81C 1/00* (2006.01)
(Continued)

(52) U.S. Cl.
CPC ....... *H04R 31/003* (2013.01); *B81C 1/00158* (2013.01); *H04R 31/006* (2013.01);
(Continued)

(58) Field of Classification Search
CPC .. B81C 1/00158; H04R 1/1016; H04R 1/105; H04R 1/04; H04R 19/04; H04R 1/08;
(Continued)

(56) References Cited

U.S. PATENT DOCUMENTS 3,622,712 A 11/1971 Moore et al.
5,408,731 A 4/1995 Berggvist et al.
(Continued)

FOREIGN PATENT DOCUMENTS

CN 101098569 1/2008
CN 101123827 2/2008
(Continued)

*Primary Examiner* — Paul D Kim
(74) *Attorney, Agent, or Firm* — Haynes and Boone, LLP

(57) ABSTRACT

An embodiment of an integrated microphone structure. The integrated microphone structure includes a first silicon substrate patterned as a first plate. A silicon oxide layer formed on one side of the first silicon substrate. A second silicon substrate bonded to the first substrate through the silicon oxide layer such that the silicon oxide layer is sandwiched between the first and second silicon substrates. A diaphragm secured on the silicon oxide layer and disposed between the first and second silicon substrates such that the first plate and the diaphragm are configured to form a capacitive microphone.

20 Claims, 31 Drawing Sheets

US 10,779,100 B2
Page 2

Related U.S. Application Data of application No. 13/973,812, filed on Aug. 22, 2013, now Pat. No. 9,264,833.

(60) Provisional application No. 61/784,880, filed on Mar. 14, 2013.

(51) Int. Cl.
   *H04R 19/00* (2006.01)
   *H04R 19/04* (2006.01)

(52) U.S. Cl.
   CPC ........ *B81C 2201/013* (2013.01); *B81C 2201/0125* (2013.01); *B81C 2201/053* (2013.01); *B81C 2203/036* (2013.01); *H04R 19/005* (2013.01); *H04R 19/04* (2013.01); *H04R 2201/003* (2013.01); *H04R 2307/027* (2013.01)

(58) Field of Classification Search
   CPC .. H04R 25/407; H04R 25/604; H04R 25/652; H04R 25/658; H04R 31/003; H04R 31/006; H04R 3/00
   See application file for complete search history.

(56) References Cited

U.S. PATENT DOCUMENTS

| | | | |
|---|---|---|---|
| 5,490,220 A | 2/1996 | Loeppert | |
| 6,219,963 B1 | 4/2001 | Wang | |
| 6,243,474 B1 | 6/2001 | Tai et al. | |
| 6,535,460 B2 | 3/2003 | Loeppert et al. | |
| 6,870,939 B2 | 3/2005 | Chiang et al. | |
| 7,003,125 B2 | 2/2006 | Yi et al. | |
| 7,329,933 B2 * | 2/2008 | Zhe | H04R 31/003 |
| | | | 181/164 |
| 7,362,873 B2 | 4/2008 | Pedersen | |
| 7,473,572 B2 | 1/2009 | Dehe et al. | |
| 7,536,769 B2 | 5/2009 | Pedersen | |
| 7,860,258 B2 | 12/2010 | Azuma et al. | |
| 8,256,093 B2 | 9/2012 | Fattinger | |
| 8,327,711 B2 | 12/2012 | Kasai et al. | |
| 8,363,860 B2 * | 1/2013 | Zhang | H04R 1/222 |
| | | | 381/175 |
| 8,477,983 B2 | 7/2013 | Weigold et al. | |
| 8,860,154 B2 * | 10/2014 | Wang | B81B 3/0078 |
| | | | 257/416 |
| 9,264,833 B2 | 2/2016 | Peng et al. | |
| 9,338,559 B2 | 5/2016 | Yang et al. | |
| 9,452,924 B2 | 9/2016 | Chu et al. | |
| 9,469,527 B2 | 10/2016 | Cheng et al. | |
| 9,511,997 B2 | 12/2016 | Cheng et al. | |
| 9,596,547 B2 | 3/2017 | Zhang | |
| 2007/0057603 A1 | 3/2007 | Azuma et al. | |
| 2011/0075866 A1 * | 3/2011 | Zhang | H04R 1/222 |
| | | | 381/174 |
| 2013/0334620 A1 | 12/2013 | Chu et al. | |
| 2016/0157038 A1 | 6/2016 | Peng et al. | |

FOREIGN PATENT DOCUMENTS

| | | |
|---|---|---|
| CN | 101346014 | 1/2009 |
| CN | 101835078 A | 9/2010 |
| CN | 102196352 | 9/2011 |
| CN | 102740203 | 10/2012 |
| CN | 102792715 | 11/2012 |
| EP | 1292171 A2 | 3/2003 |

* cited by examiner

METHOD FOR MANUFACTURING A MICROPHONE

PRIORITY DATA

The present application is a divisional application of U.S. patent application Ser. No. 15/018,625, filed Feb. 8, 2016, now U.S. Pat. No. 9,998,843, which is a divisional application of U.S. patent application Ser. No. 13/973,812, filed Aug. 22, 2013, now U.S. Pat. No. 9,264,833, which claims priority to U.S. Provisional Patent Application No. 61/784,880, filed on Mar. 14, 2013, each of which is hereby incorporated by reference in its entirety.

BACKGROUND

For silicon microphone, the existing manufacturing method often includes complex processes or special materials with particular dimension restriction. Therefore, an improved structure and method for silicon microphone are needed to address the above issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
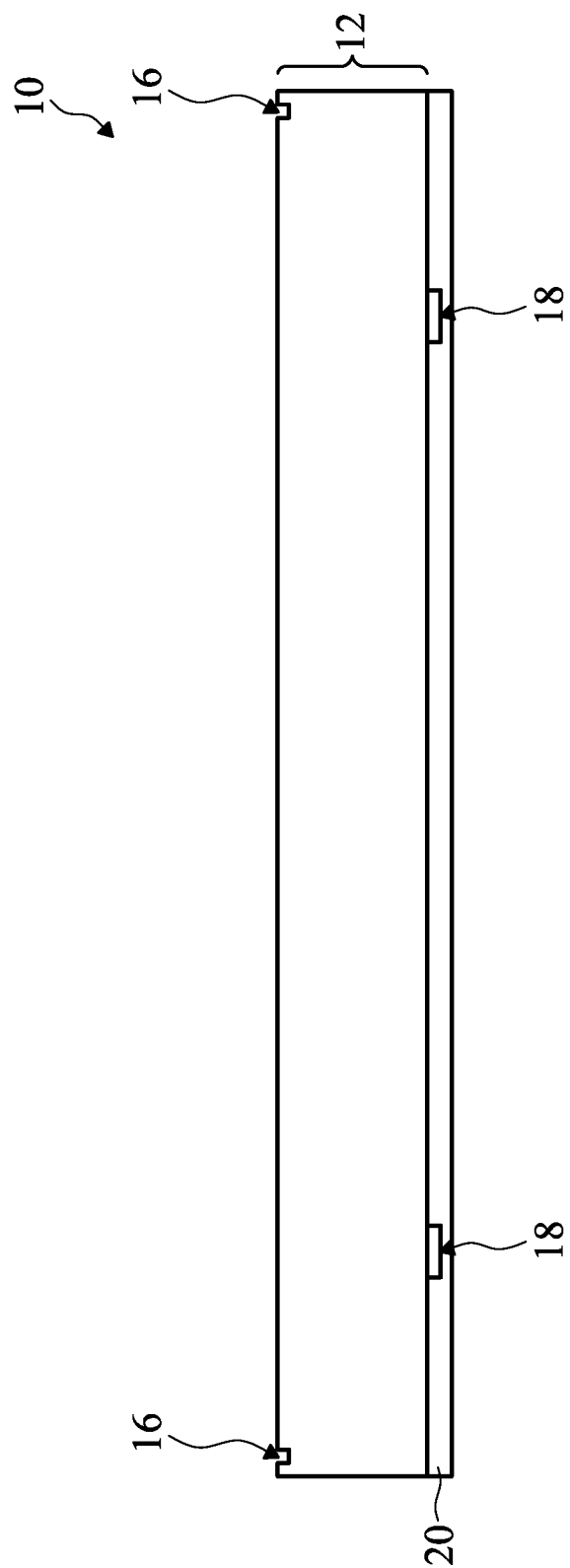
FIGS. 1-13 illustrate sectional views of an integrated microphone structure at various fabrication stages constructed according to aspects of the present disclosure in one embodiment.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIGS. 1-13 illustrate sectional views of an integrated microphone structure 10 at various fabrication stages constructed according to aspects of the present disclosure in one embodiment. The integrated microphone structure 10 and the method making the same are described collectively with reference to FIGS. 1-13.

Referring to FIG. 1, the integrated microphone structure 10 includes a semiconductor substrate 12. In the present embodiment, the semiconductor substrate 12 is a silicon substrate, such as a silicon wafer. The silicon substrate 12 is heavily doped as it is patterned to be a conductive plate at later stage. In one example, the silicon substrate 12 is n-type doped, such as phosphorus doped. In one embodiment, the silicon substrate 12 is doped to have a resistivity ranging between about 0.001 Ohm·cm ($\Omega$·cm) and about 0.002 $\Omega$·cm. In one embodiment, the silicon substrate 12 is doped to have a resistivity ranging between about 0.007 $\Omega$·cm and about 0.025 $\Omega$·cm. In another embodiment, the silicon substrate 12 is double side polished with proper thickness and flatness. In the present example, alignment marks 16 are formed on a first side of the silicon substrate 12 for alignment purpose during lithography process. In furtherance of the example, the alignment marks 16 are formed on the backside of the silicon substrate 12.

A dielectric material layer 18 is formed on the second side of the silicon substrate 12 and is further patterned to form trench barrier (still referred to as 18). The function of the trench barrier 18 includes a barrier for isolation trench and will be further explained at later fabrication stage. In one embodiment, the dielectric material layer 18 is a silicon nitride layer and is deposited by a suitable technique, such as chemical vapor deposition (CVD). In furtherance of the embodiment, the dielectric material layer 18 is a low stress silicon nitride (LSN) layer.

A first silicon oxide layer 20 is further formed on the silicon substrate 12 from the second side. In one embodiment, the silicon oxide layer 12 has a thickness from about 2 micron to about 4 micron. In another embodiment, the silicon oxide layer 12 is deposited by CVD or other suitable technique.

Figure 2:
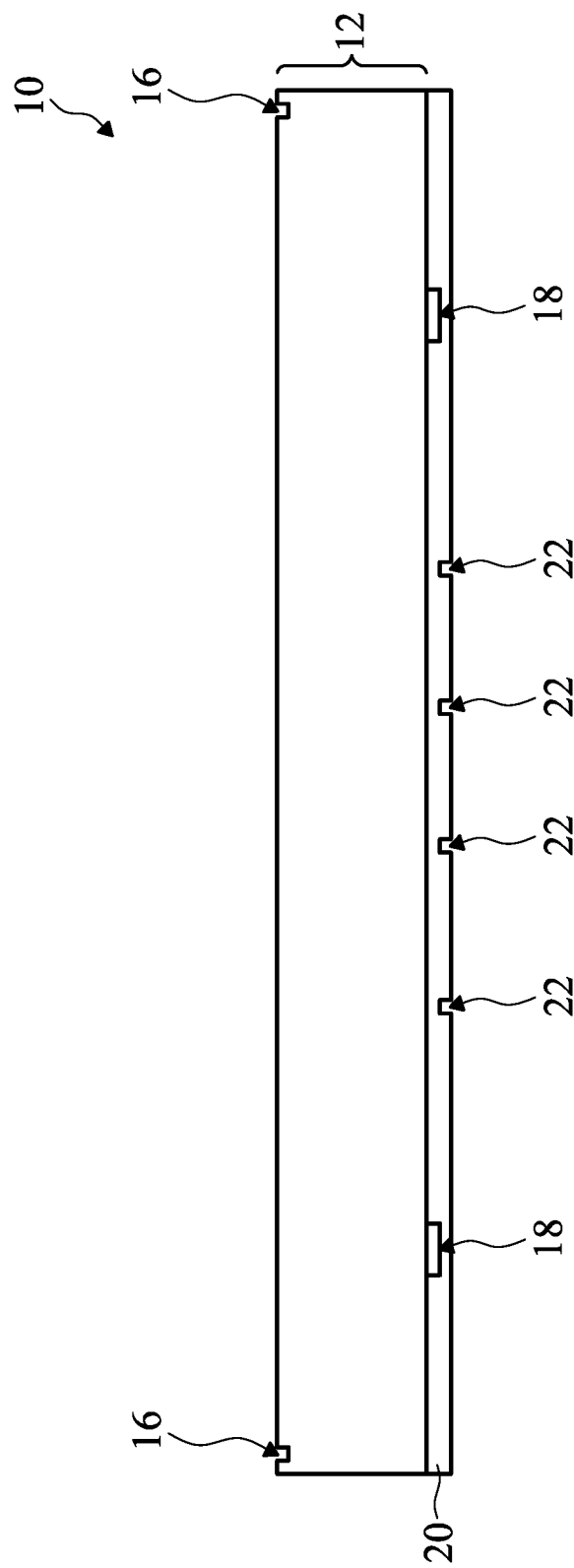

Referring to FIG. 2, a patterning process is implemented to the silicon oxide layer 20 to form various trenches 22 for diaphragm bump. In one embodiment, the patterning process includes a lithography process to form a patterned resist layer with openings that define trench regions and an etching process to etch the silicon oxide layer 20 using the patterned resist layer as an etch mask. The etching process include dry etch or wet etch (such as hydrofluoric acid or HF solution).

Figure 3:
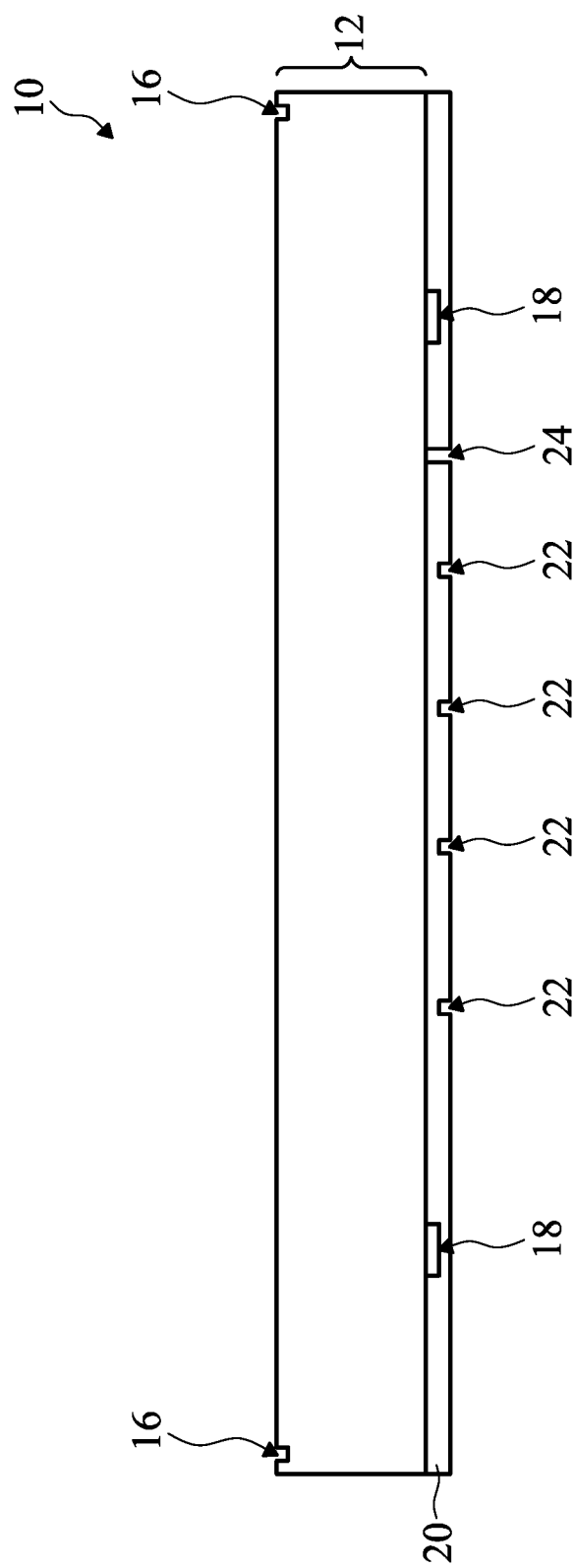

Referring to FIG. 3, another patterning process is implemented to the silicon oxide layer 20 to form diaphragm via 24 for diaphragm electrical routing. The diaphragm via 24 is a through via such that the silicon substrate 12 is exposed within the diaphragm via 24.

Figure 4:
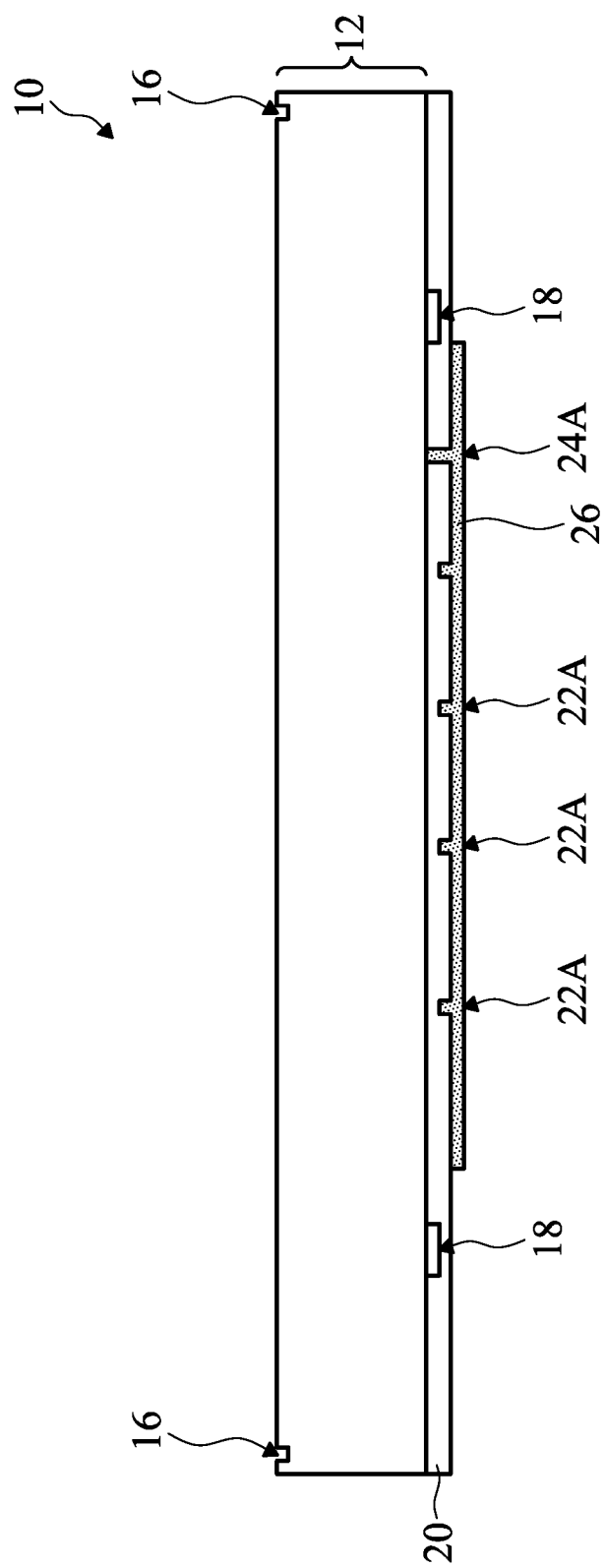

Referring to FIG. 4, a diaphragm 26 is formed on the silicon oxide layer 20. The particularly, the diaphragm 26 also fills in the trenches 22 to form diaphragm bumps 22A and fills in the diaphragm via 24 to form a diaphragm plug 24A. In the present embodiment, the diaphragm 26 includes polycrystalline silicon (polysilicon) doped to be conductive. In one embodiment, the diaphragm 26 is formed by deposition and patterning. In one example, the deposition includes CVD or other suitable technique. The patterning includes a lithography process and etching. Alternatively, the diaphragm 26 may use other conductive material, such as metal or metal alloy chosen and deposited with low stress. The diaphragm 26 may also be formed to have particular structures, such as corrugated or perforated diaphragms, to relieve film stress.

Figure 5:
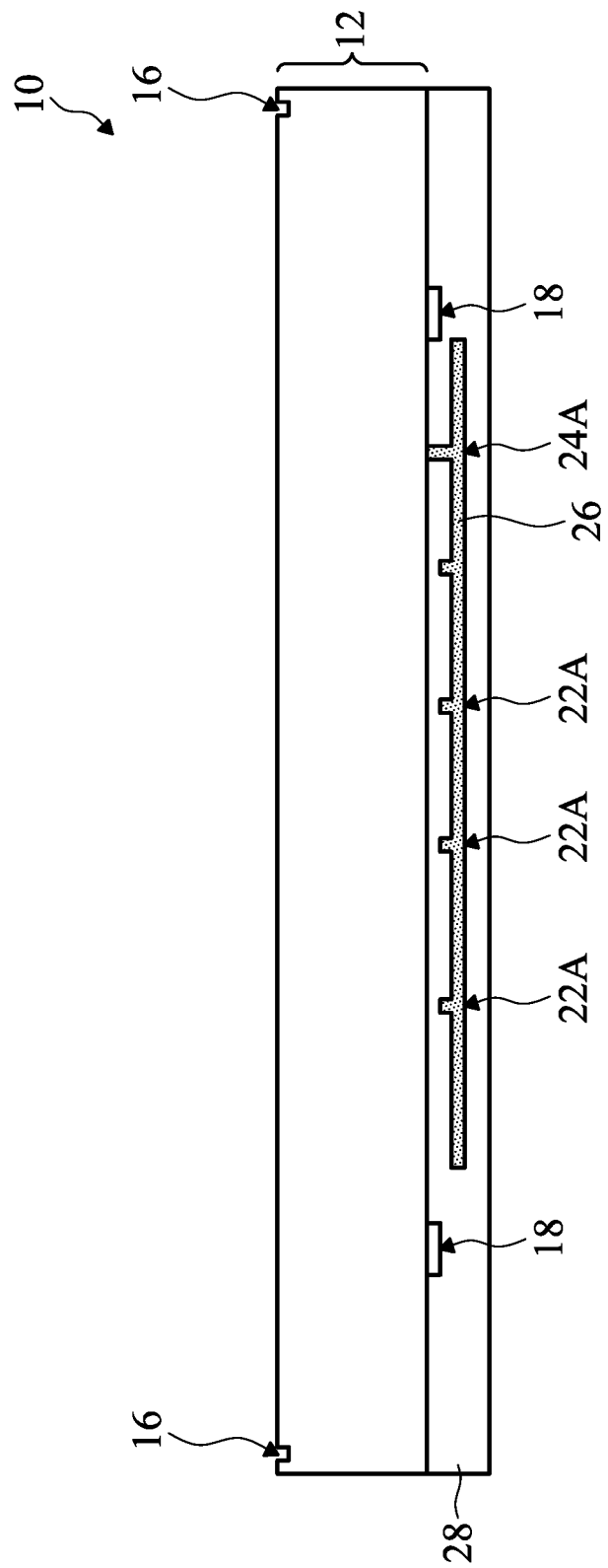

Referring to FIG. 5, a second silicon oxide layer is formed on the diaphragm 26 and the silicon oxide layer 20. The second silicon oxide layer and the first silicon oxide layer 20 are collectively referred to as silicon oxide layer 28. In one embodiment, the second silicon oxide layer is deposited by CVD or other suitable technique. In the present embodiment, a polishing process, such as chemical mechanical polishing (CMP) process, is further applied to the second silicon oxide layer for planarization.

Figure 6:
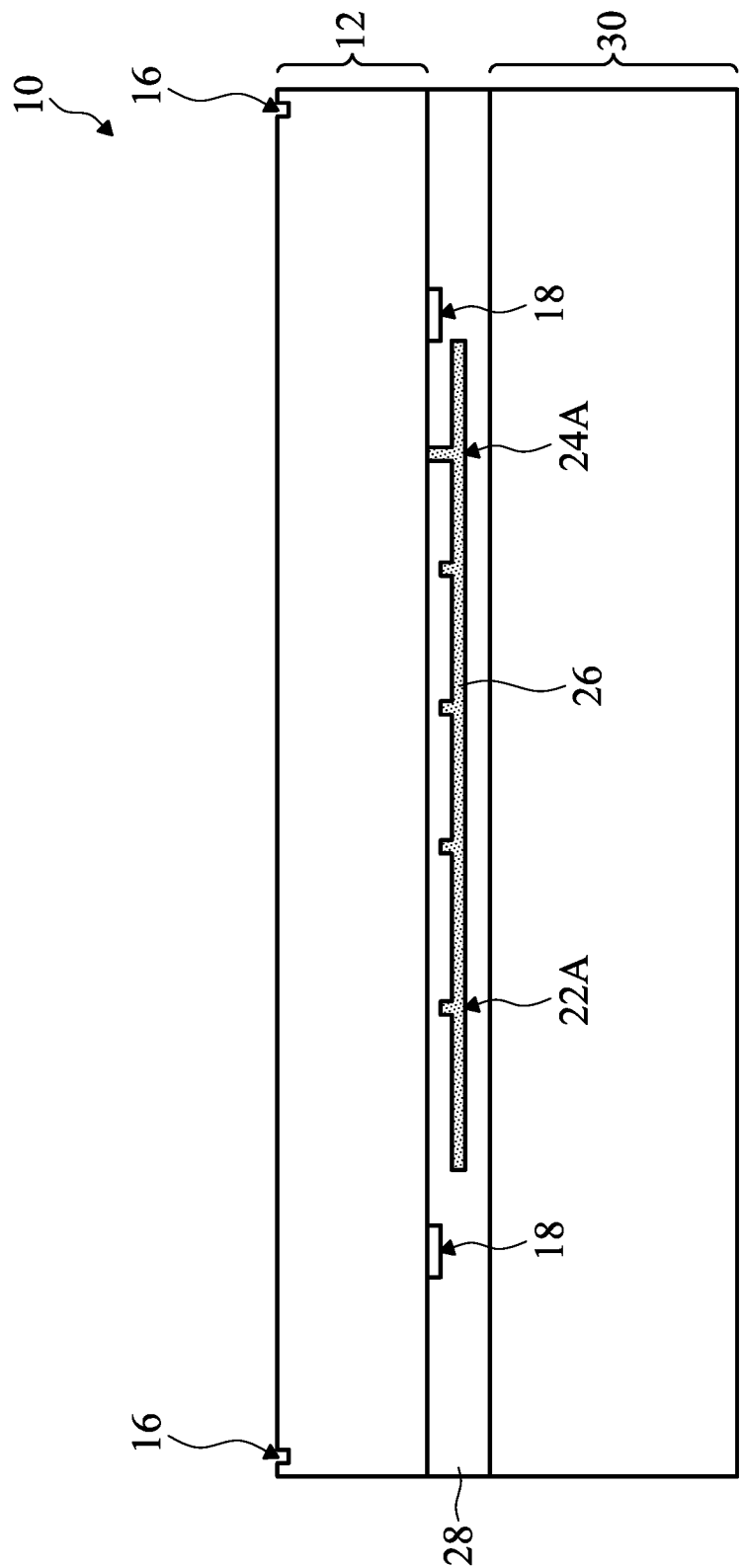

Referring to FIG. 6, a second substrate 30 as a carrier substrate is boned to the first substrate 12 through the silicon oxide layer 28. In the present embodiment, the second substrate 30 is a silicon substrate (such as a silicon wafer) and is bonded to the silicon oxide layer 28 by fusion bonding. In this example, the fusion bonding is between silicon and silicon oxide. The CMP process at the previous step provides a smooth and flat surface to enhance the bonding effect.

Figure 7:
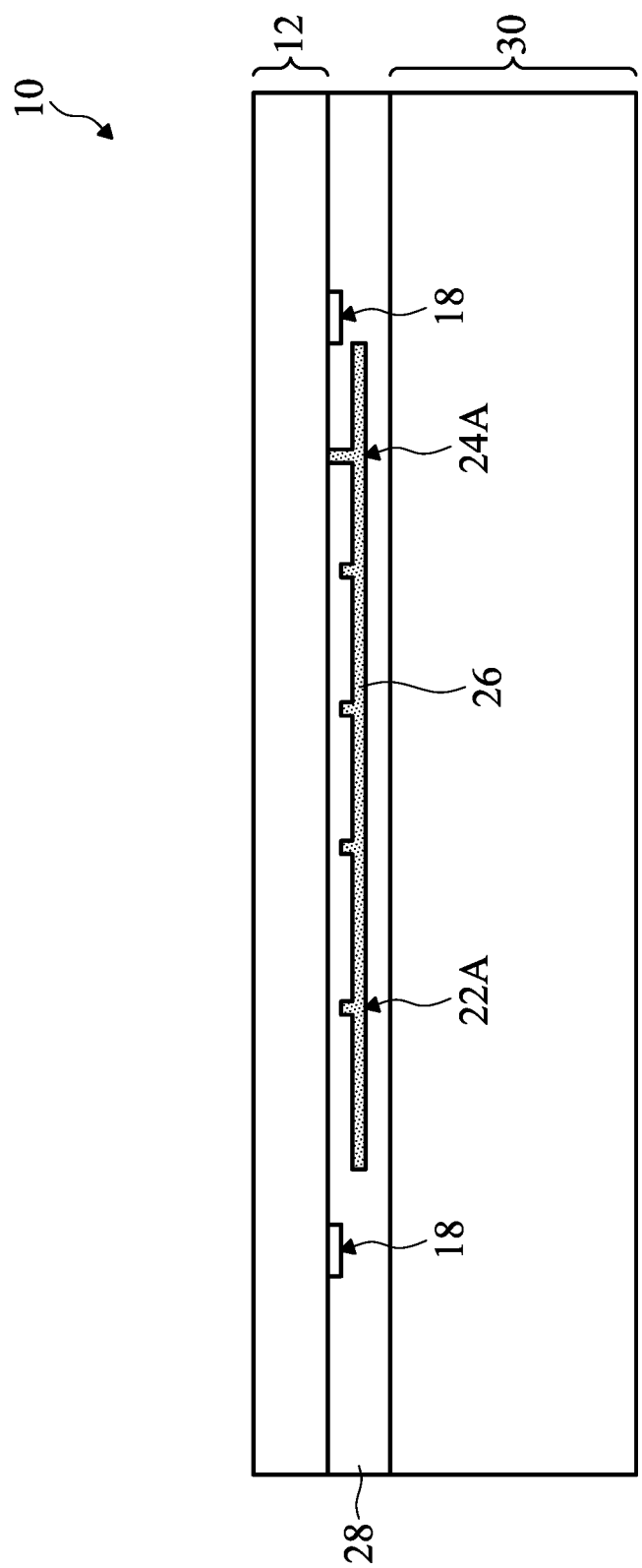

Referring to FIG. 7, a polishing process is applied to the first silicon substrate 12 from the first side (the backside) of the first silicon substrate to reduce the thickness thereof. In the present embodiment, after the polishing, the thickness of the first silicon substrate 12 is reduced to about 10 micron or less. In one embodiment, the polishing process includes CMP. In another embodiment, the polishing process may including grinding and then CMP.

Figure 8:
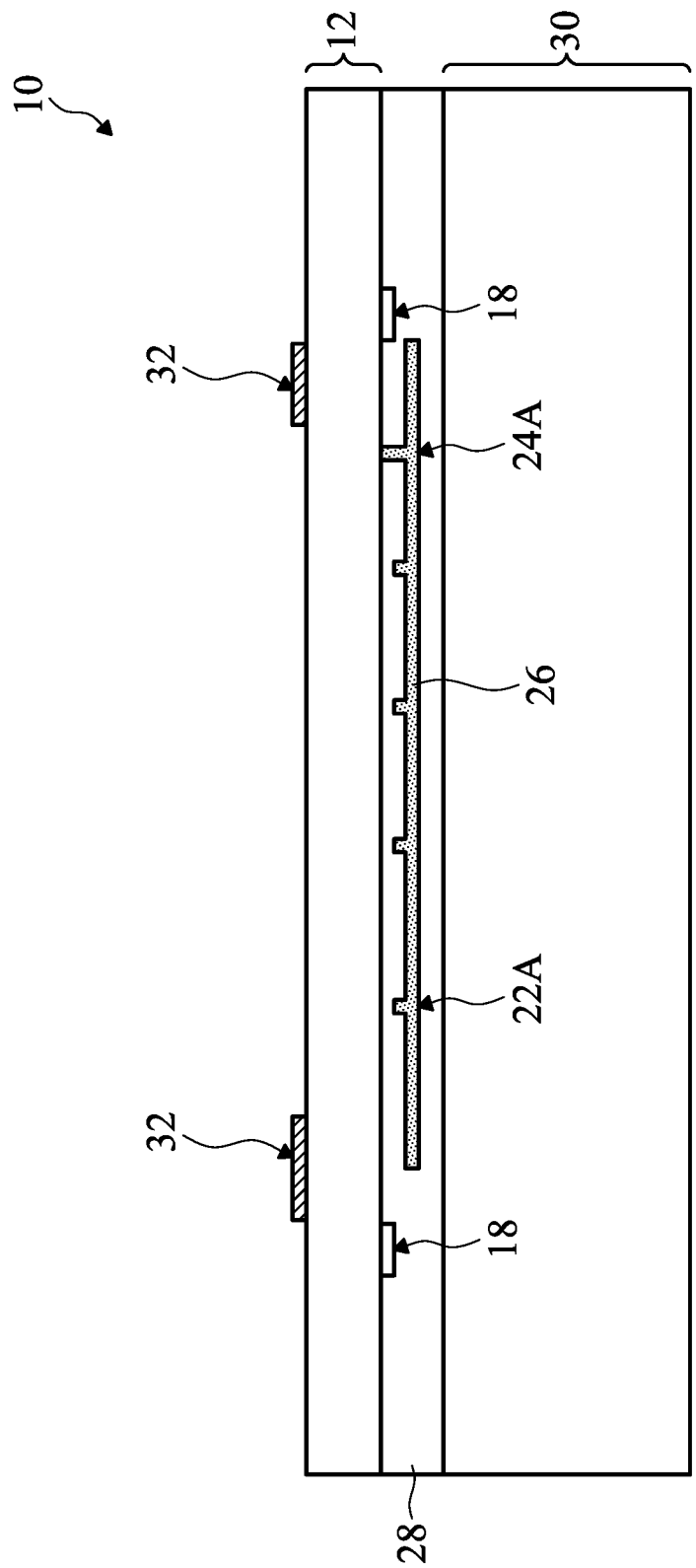

Referring to FIG. 8, metal pads 32 are formed on the backside of the first silicon substrate 12 for electrical routing (such as contact pads for diaphragm and plate). Especially, the metal pads 32 are formed on the polished surface. In one embodiment, the metal pads 32 include suitable metal or metal alloy, such as copper, aluminum, gold, silver or combination thereof. The formation of the metal pads 32 includes deposition and patterning. The deposition includes physical vapor deposition (PVD) or other suitable technique.

Figure 9:
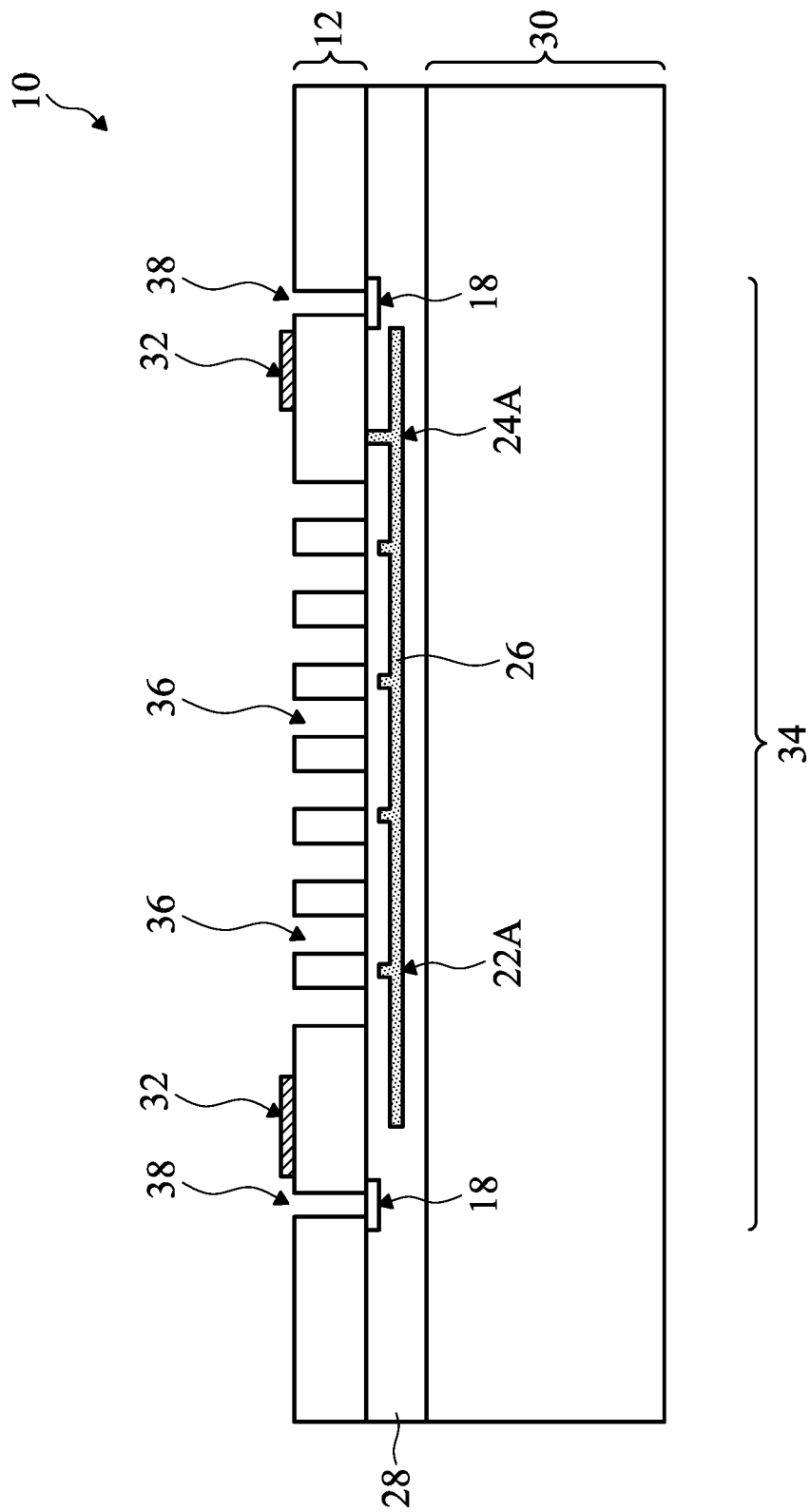

Referring to FIG. 9, a patterning process is applied to the first silicon substrate 12 to form a plate of the integrated microphone. The plate is also referred to as 12 in the following description. The patterning process forms a various trenches in the first silicon substrate 12, including trenches 36 and isolation trenches 38. The trenches 36 are through-trenches such that the silicon oxide layer 28 is exposed within the trenches 36. The trenches 36 provide a path for acoustic wave to reach the diaphragm 26 during field application. In various embodiments, the acoustic wave may approach the diaphragm from either top or bottom side, with proper packaging structure.

The trenches 36 also provide a path for silicon oxide etch to release the diaphragm at later fabrication stage. The isolation trenches 38 are configured on edges of a microphone unit (a microphone cell) 34 for isolation purpose, such as isolating the microphone unit 34 from other circuit components. The isolation trenches 38 are aligned with the trench barrier 18 such that the first silicon substrate 12 is not exposed within the isolation trenches 38. The trench barrier prevents the silicon dioxide layer under the isolation trenches from being etched in the subsequent release-etch process. In one example, the metal pads 32 are configured on the first silicon substrate 12 such that an isolation trench 38 is separated from the plurality of trenches 36 by a metal pad 32. The patterning process includes lithography process and etching.

Figure 10:
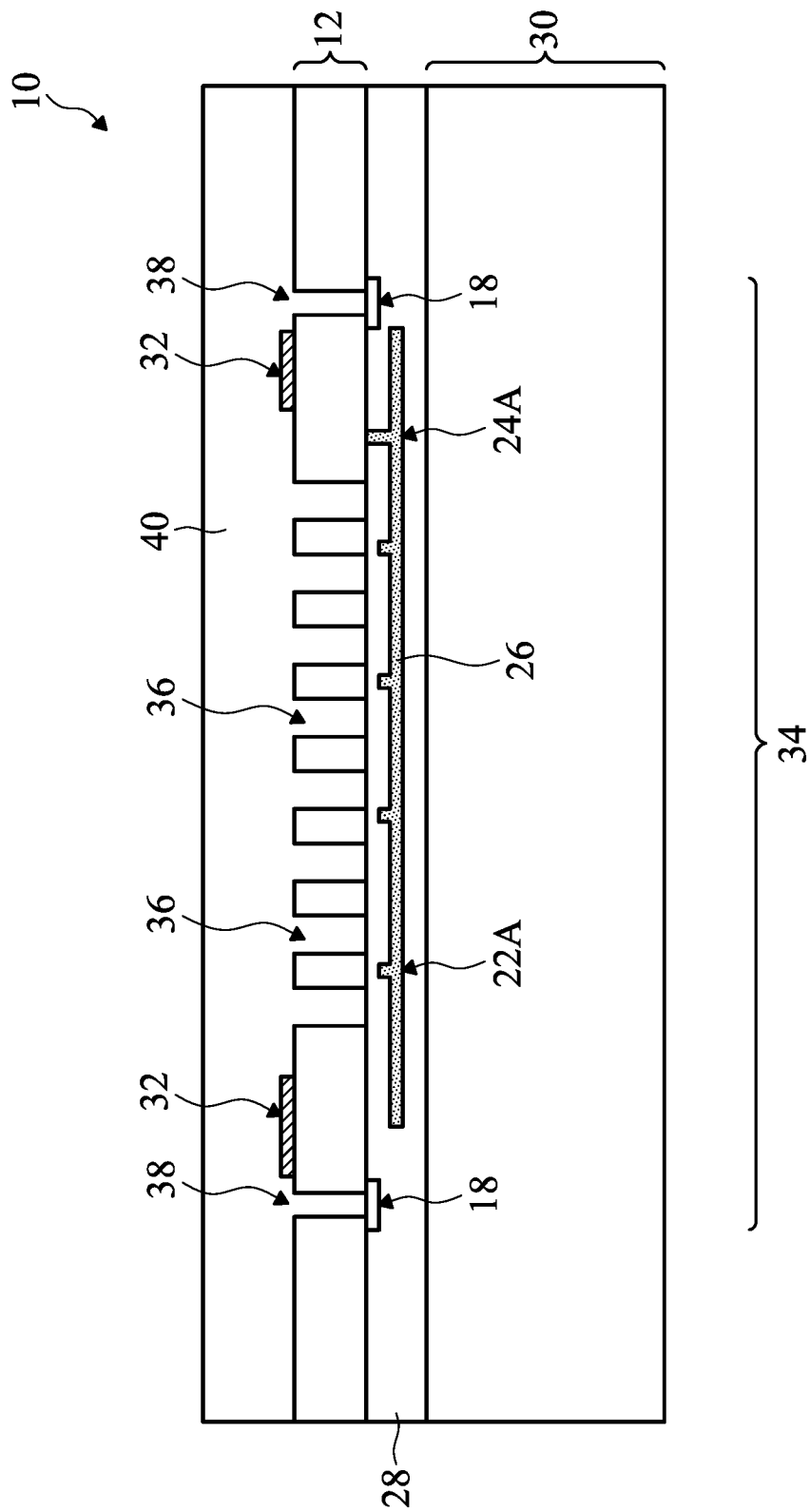

Referring to FIG. 10, a protection layer 40 is coated on the first silicon substrate 12 such that the plate is protected from, such as scratching and potential damages (especially potential damages potential damages in the subsequent cavity etching process, where the wafer is flipped upside down for cavity etching and the front side of the wafer touches the wafer stage/platform of the etching tool). In the present embodiment, the protection layer 40 is a photoresist layer (resist layer) coated by spin-on coating. The protection layer may also be formed by a procedure that includes spin-coating film transfer and hot pressing (or STP process).

Figure 11:
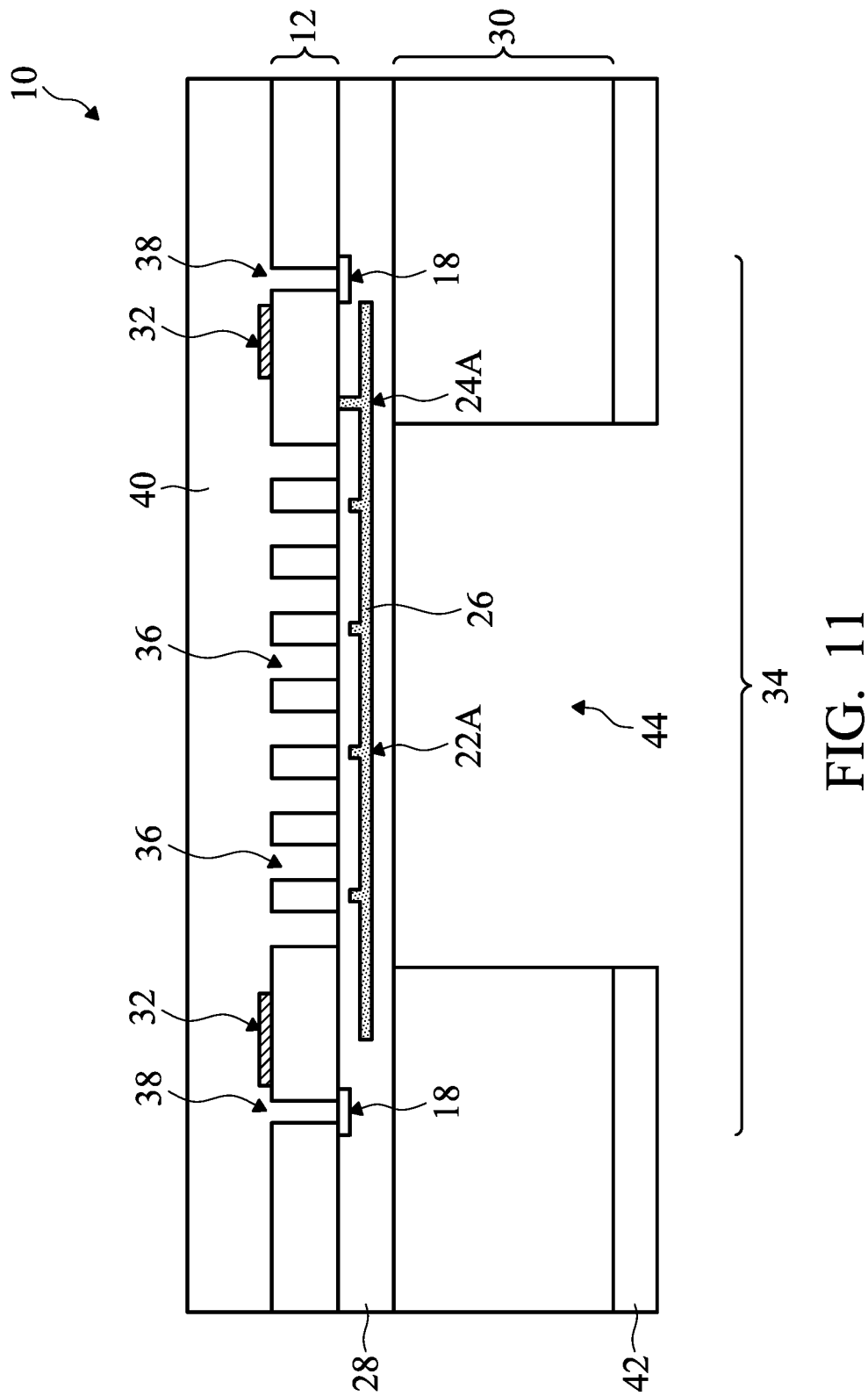

Referring to FIG. 11, a patterning process is applied to the second silicon substrate 30 to form a cavity (backside cavity or BCAV) 44 therein. The silicon oxide layer 28 is exposed in the cavity 44. The patterning process includes lithography process and etching process. Particularly, the lithography process forms a patterned resist layer 42 on the second substrate 30. The etching process selectively etches the second substrate 30 to form the cavity 44 using the patterned resist layer 42 as an etch mask. During the etching process, the first silicon substrate 12 is protected from the etching by the protection layer 40.

Figure 12:
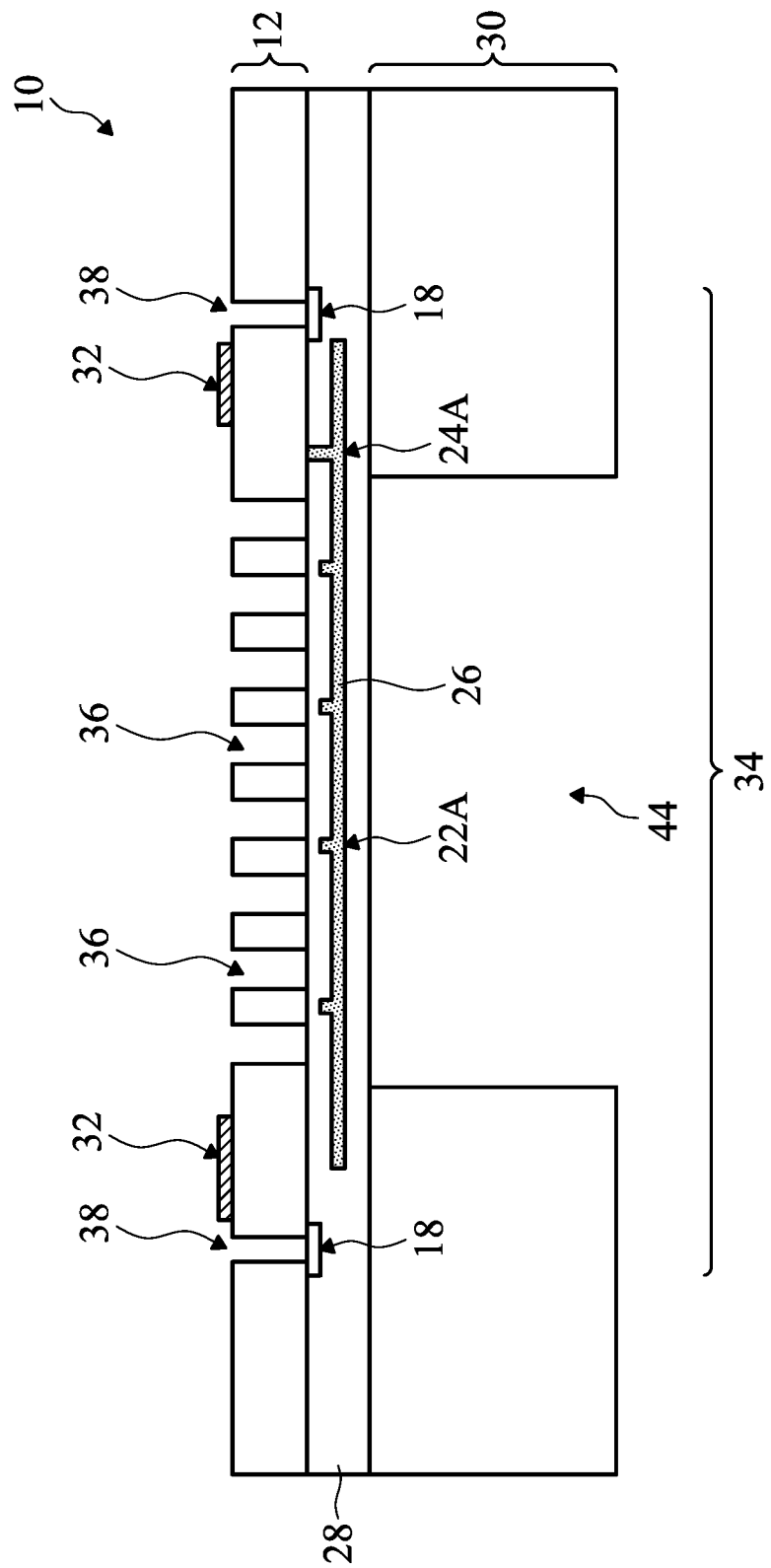

Referring to FIG. 12, the protection layer 40 (a resist layer in the present embodiment, or any suitable protection layer if using the STP process rather than traditional photoresist coating process) and the patterned resist layer 42 are removed by a suitable technique, such as ashing or wet stripping. In one example, the resist layers 40 and 42 are removed simultaneously by one process, such as ashing from both sides (double side ashing).

Figure 13:
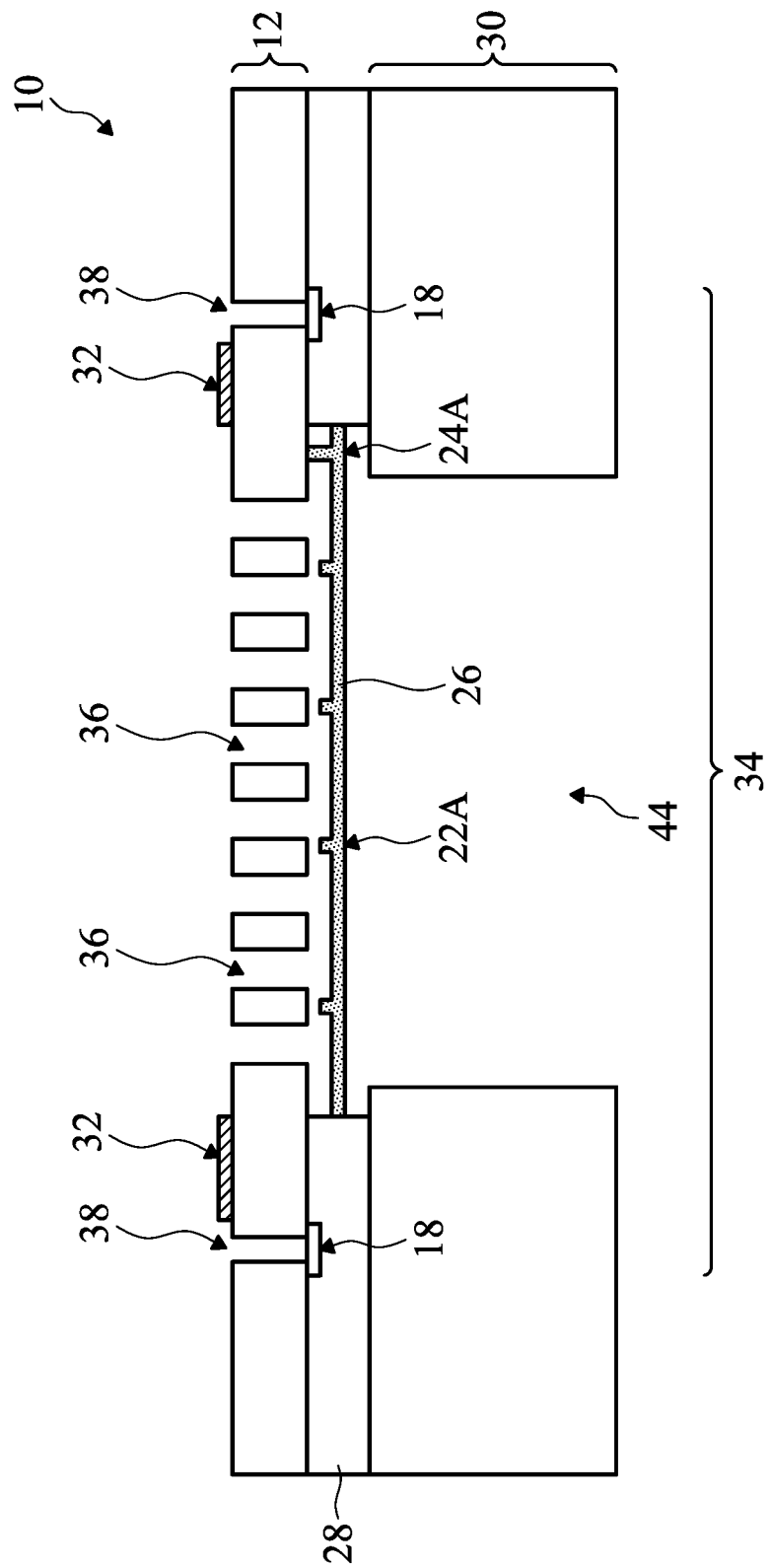

Referring to FIG. 13, an etching process is applied to selectively etch the silicon oxide layer 28 from the first side through the trenches 36 and the second side through the cavity 44. The isolation trenches 38 are blocked by the trenches barrier 18 so that the etching to the silicon oxide layer 28 through the isolation trenches 38 is eliminated. In the present embodiment, vapor hydrofluoric acid (vapor HF) is used as etchant to etch the silicon oxide layer 28. Thereby, the diaphragm 26 is released. Particularly, the diaphragm 26 is secured by the silicon oxide layer 28 and its central portion is movable to response to acoustic wave.

The bumps 22A are designed to prevent the diaphragm 26 from sticking to the plate 12 (the first silicon substrate). The diaphragm plug 24A is configured to provide electrical routing to the diaphragm 26. In one embodiment, the diaphragm 26 is connected to one of the metal pads 32 through the diaphragm plug 24A and the plate 12 is connected to another of the metal pads 32.

Thus formed microphone structure 10 includes the diaphragm 26 and the plate 12 configured to form a capacitive microphone. The integrated microphone structure 10 and the method making the same have various advantages in different embodiments. In one embodiment, using to silicon substrates bonded thorough silicon and silicon oxide by fusion bonding, the process is simple and cost effective. In another embodiment, the process flow of the method is compatible with and is easier to be integrated with other integrated circuit components, such as other microelectromechanical system (MEMS) features or transistors.

FIGS. 14-31 illustrate sectional views of an integrated microphone structure 60 at various fabrication stages constructed according to aspects of the present disclosure in another embodiment. The integrated microphone structure 60 and the method making the same are described collectively with reference to FIGS. 14-31. Particularly, the integrated microphone structure 60 includes double plates.

Figure 14:
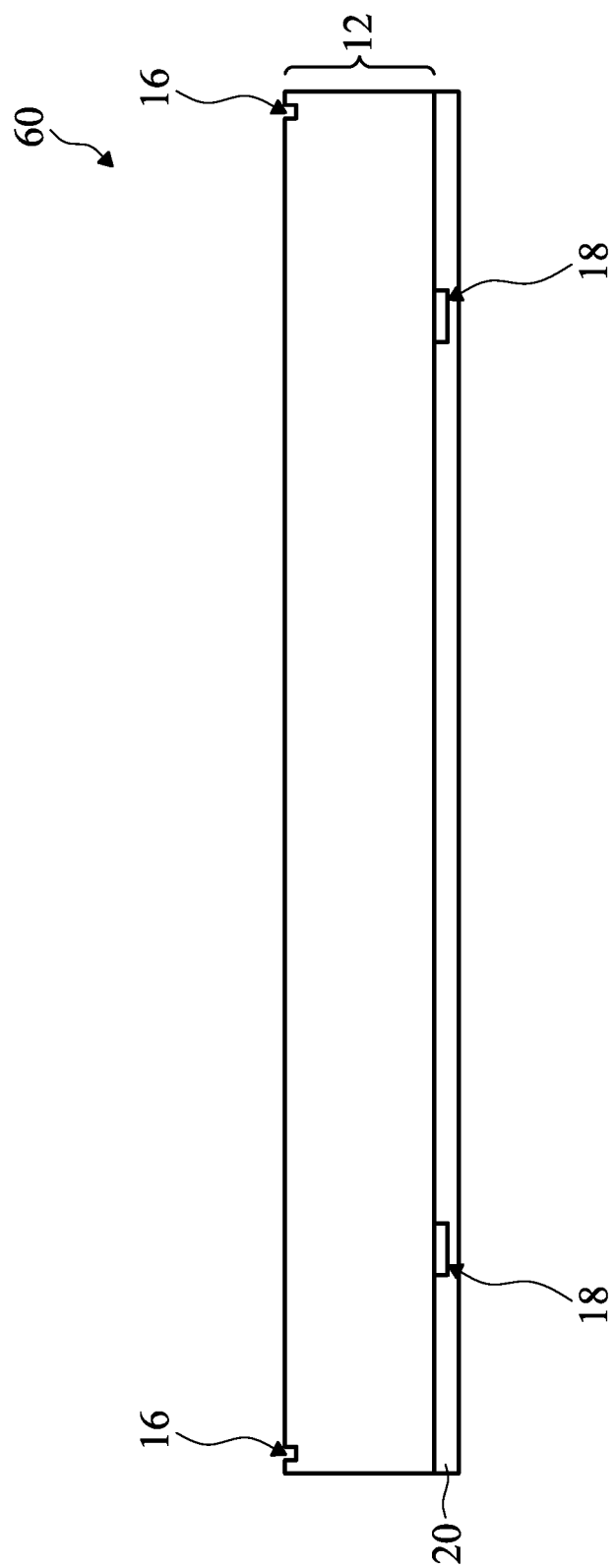
FIGS. 14-31 illustrate sectional views of an integrated microphone structure at various fabrication stages constructed according to aspects of the present disclosure in another embodiment.

Referring to FIG. 14, the integrated microphone structure 10 includes a semiconductor substrate 12. In the present embodiment, the semiconductor substrate 12 is a silicon substrate, such as a silicon wafer. The silicon substrate 12 is heavily doped as it is patterned to be a conductive plate at later stage. In one example, the silicon substrate 12 is n-type doped, such as phosphorus doped. In one embodiment, the silicon substrate 12 is doped to have a resistivity ranging between about 0.001 $\Omega\cdot$cm and about 0.002 $\Omega\cdot$cm. In another embodiment, the silicon substrate 12 is doped to have a resistivity ranging between about 0.007 $\Omega\cdot$cm and about 0.025 $\Omega\cdot$cm. In another embodiment, the silicon substrate 12 is double side polished with proper thickness and flatness. In the present example, alignment marks 16 are formed on a first side of the silicon substrate 12 for alignment purpose during lithography process. In furtherance of the example, the alignment marks 16 are formed on the backside of the silicon substrate 12.

A dielectric material layer 18 is formed on the second side of the silicon substrate 12 and is further patterned to form trench barrier (still referred to as 18). The function of the trench barrier 18 includes a barrier for isolation trench and will be further explained at later fabrication stage. In one embodiment, the dielectric material layer 18 is a silicon nitride layer and is deposited by a suitable technique, such as CVD. In furtherance of the embodiment, the dielectric material layer 18 is a low stress silicon nitride (LSN) layer.

A first silicon oxide layer 20 is further formed on the silicon substrate 12 from the second side. In one embodiment, the silicon oxide layer 12 has a thickness from about 2 micron to about 4 micron. In another embodiment, the silicon oxide layer 12 is deposited by CVD or other suitable technique.

Figure 15:
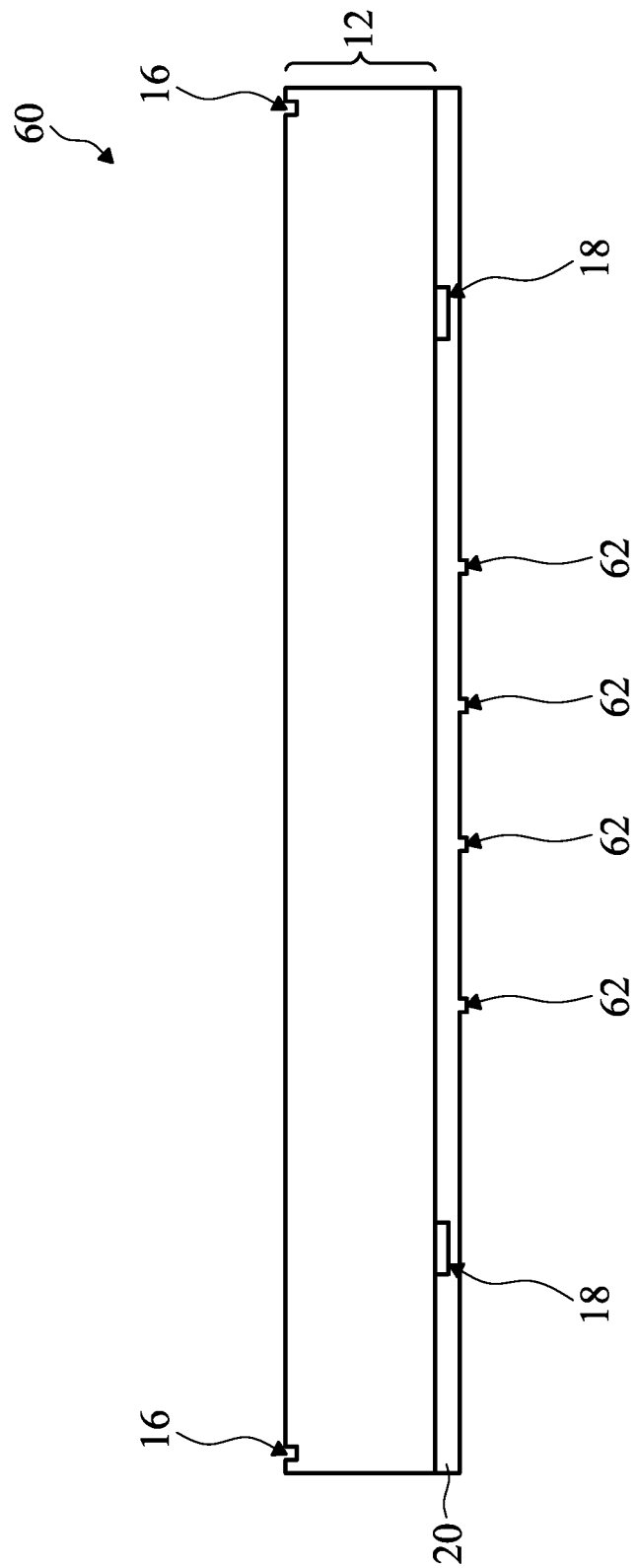

Referring to FIG. 15, a patterning process is applied to the silicon oxide layer 20 to form dielectric features 62 for bottom diaphragm bumps to be formed at later fabrication steps. In one embodiment, the patterning process includes a lithography process to form a patterned resist layer and an etching process to etch the silicon oxide layer 20 using the patterned resist layer as an etch mask. The etching process include dry etch or wet etch (such as hydrofluoric acid or HF solution).

Figure 16:
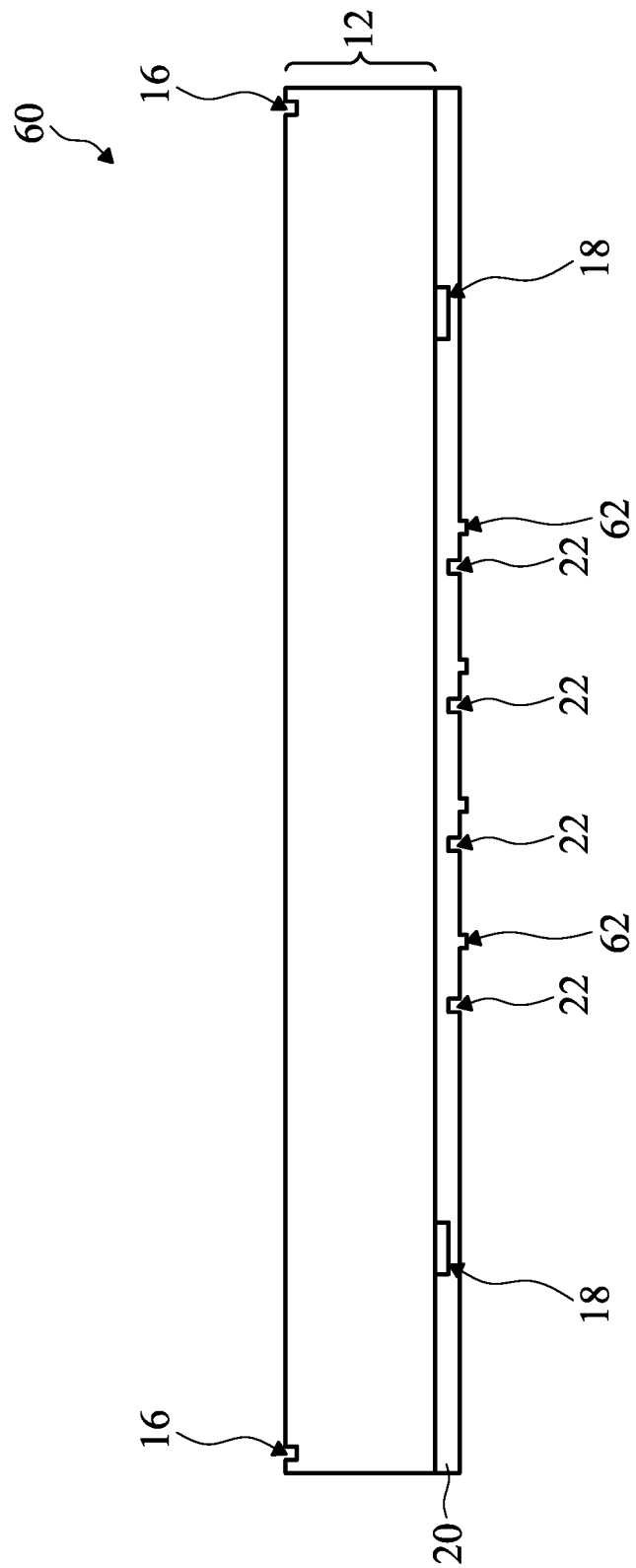

Referring to FIG. 16, a second patterning process is applied to the silicon oxide layer 20 to form various trenches 22 for top diaphragm bump.

Figure 17:
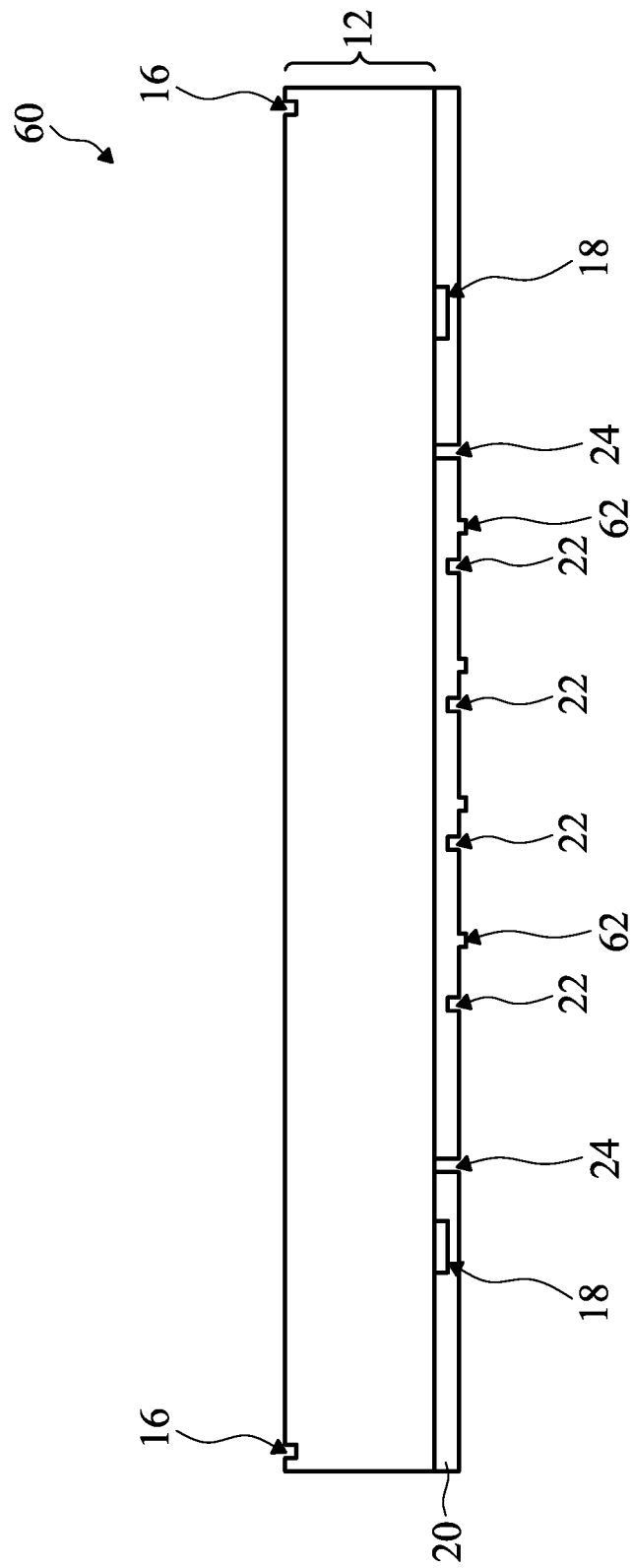

Referring to FIG. 17, a third patterning process is applied to the silicon oxide layer 20 to form vias 24 for electrical routing. The vias 24 are through vias such that the silicon substrate 12 is exposed within the vias 24.

Figure 18:
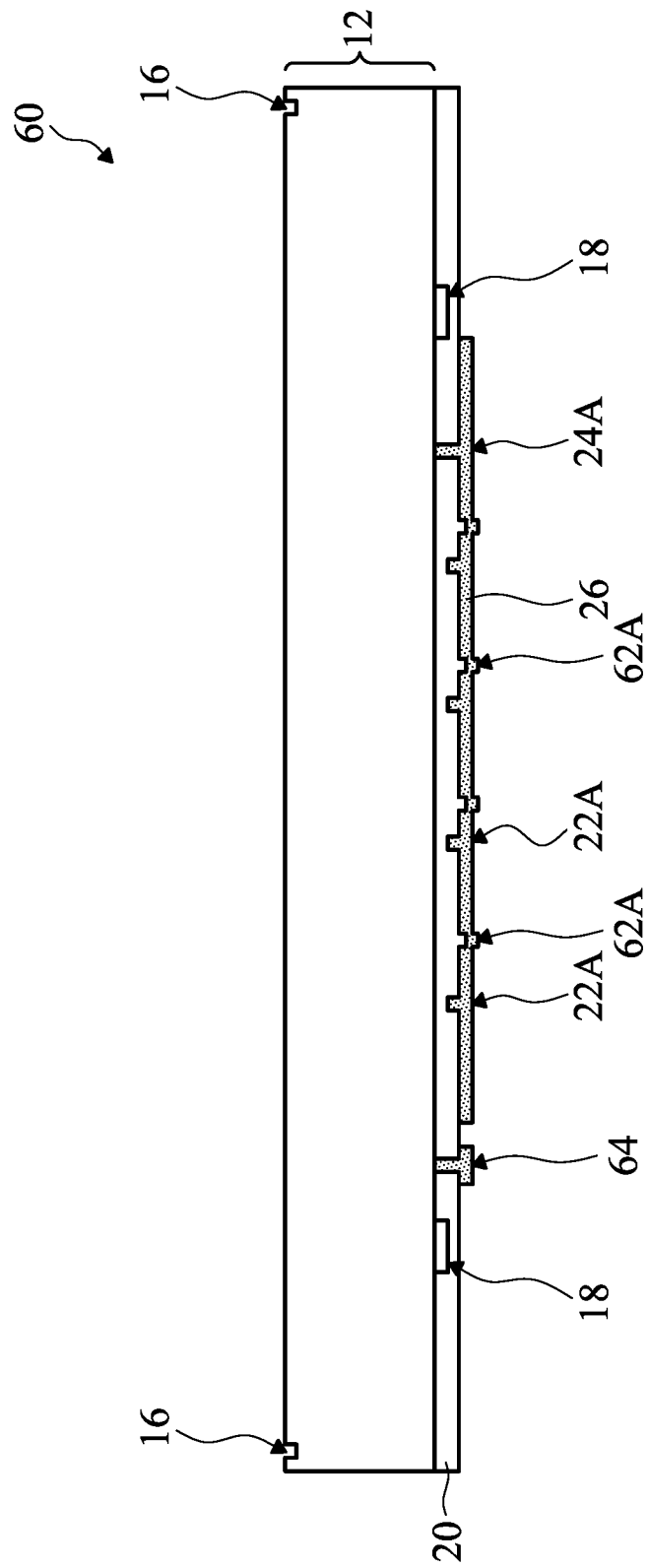

Referring to FIG. 18, a diaphragm 26 is formed on the silicon oxide layer 20. The particularly, the diaphragm 26 also fills in the trenches 22 to form top diaphragm bumps 22A and fills in the vias 24 to form plugs 24A. Furthermore, the diaphragm 26 also includes bottom diaphragm bumps 62A that are formed due to the existence of dielectric bumps 62.

In the present embodiment, the diaphragm 26 includes polysilicon doped to be conductive. In one embodiment, the diaphragm 26 is formed by deposition and patterning. In one example, the deposition includes CVD or other suitable technique. Especially, the polisilcion layer is patterned to form the diaphragm 26 and also a conductive feature 64 separated from the diaphragm 26. The conductive feature 64 is aligned with one of the vias 24 and includes the corresponding plug 24A. The conductive feature 64 provides a path for electrical routing to a bottom plate while the plug 24A connected with the diaphragm 26 provides electrical routing for the diaphragm 26.

Alternatively, the diaphragm 26 may use other conductive material, such as metal or metal alloy chosen and deposited with low stress. In various embodiments, the diaphragm 26 may be formed to have particular structures, such as corrugations or perforated diaphragms, to relieve film stress.

Figure 19:
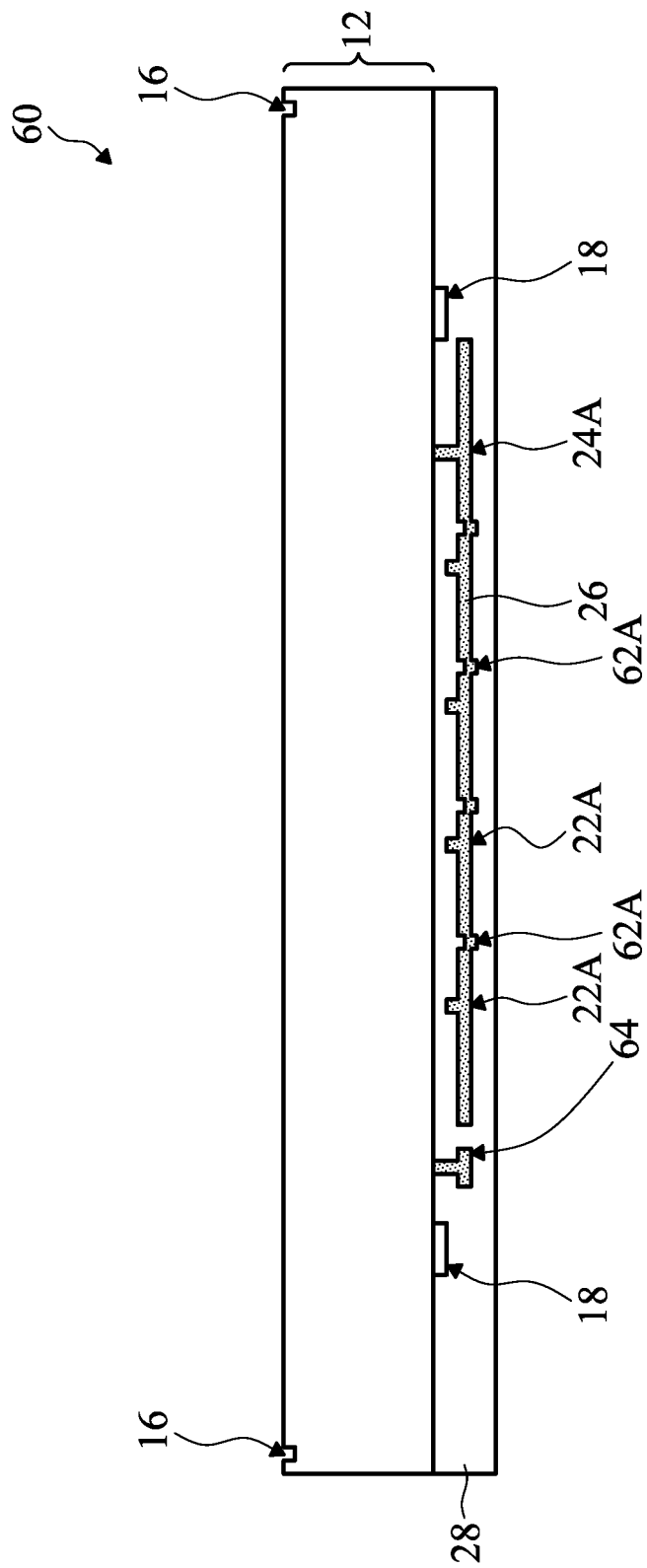

Referring to FIG. 19, a second silicon oxide layer is formed on the diaphragm 26 and the silicon oxide layer 20. The second silicon oxide layer and the first silicon oxide layer 20 are collectively referred to as silicon oxide layer 28. In one embodiment, the second silicon oxide layer is deposited by CVD or other suitable technique. In the present embodiment, a polishing process, such as CMP, is further applied to the second silicon oxide layer for planarization.

Figure 20:
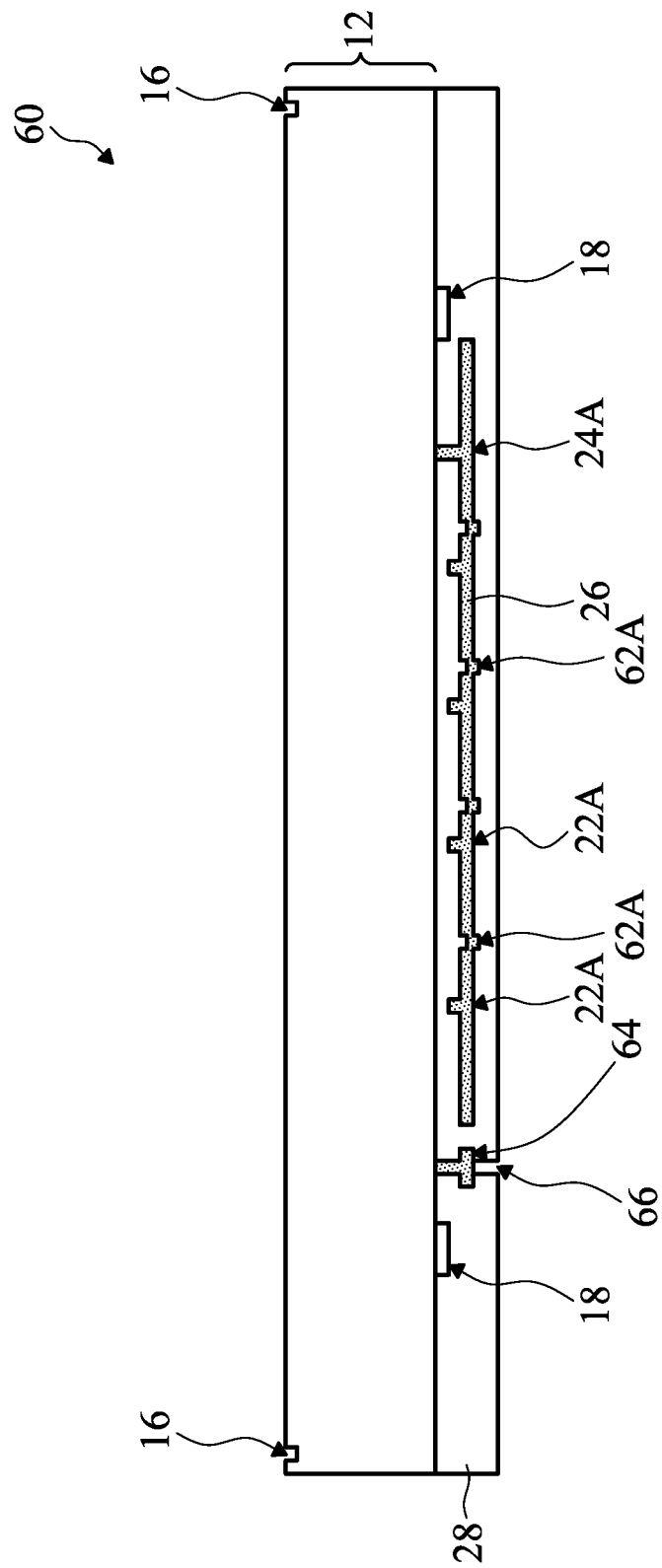

Referring to FIG. 20, a patterning process is applied to the silicon oxide layer 28 to form a back plate via 66 in the second silicon oxide layer 28. Especially, the back plate via 66 is aligned with the conductive feature 64 such that the conductive feature 64 is exposed within the back plate via 66. The back plate via 66 is also for electrical routing.

Figure 21:
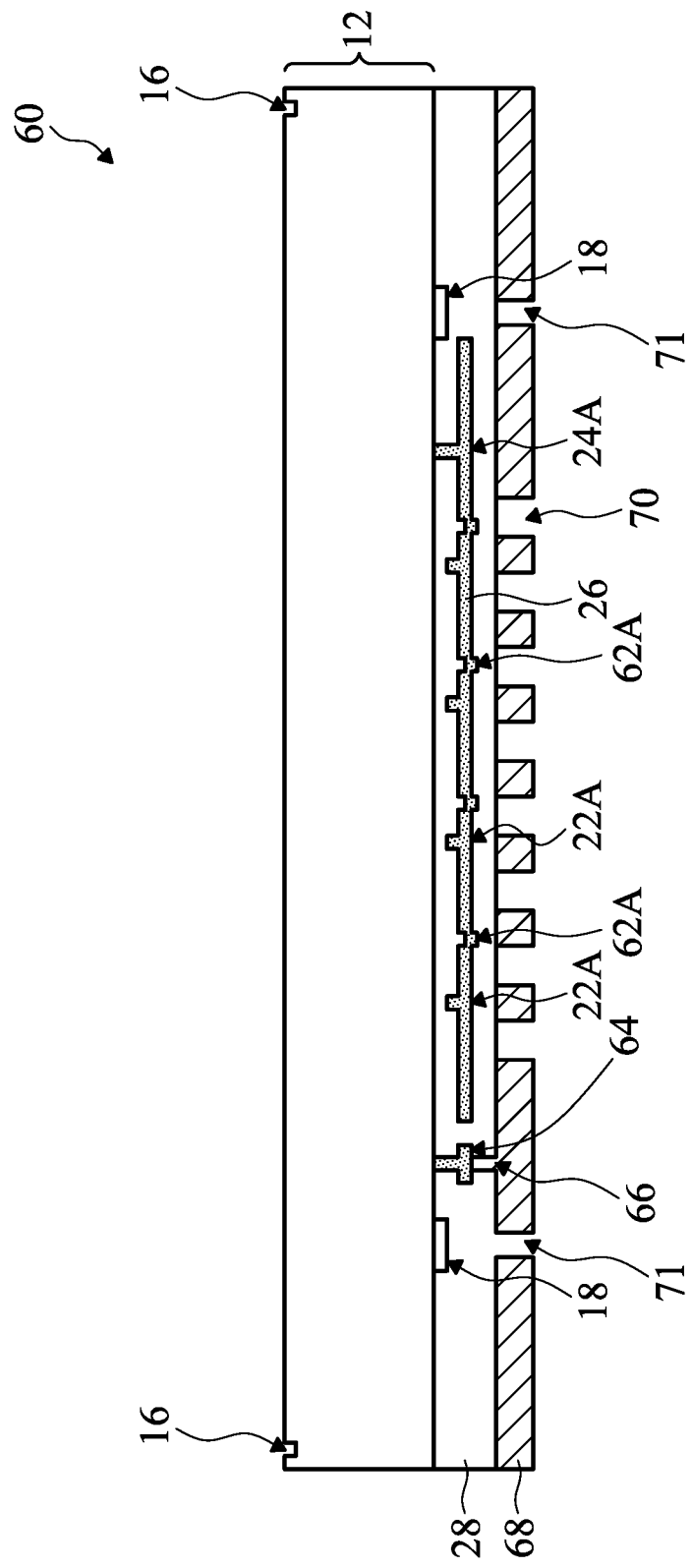

Referring to FIG. 21, a back plate (bottom plate or plate) 68 is formed on the silicon oxide layer 28. The back plate 68 includes a conductive material layer patterned to have a plurality of vias (through openings) 70 and also isolation vias 71 for isolation purpose such that the microphone unit is isolated from adjacent circuit components, such as other microphone units or drive circuit. In the present embodiment, the back plate 68 includes polysilicon doped to be conductive. The formation of the back plate 68 includes deposition and patterning. The deposition includes CBD or other suitable process. The patterning includes lithography process and etching to form various vias (70 and 71).

Figure 22:
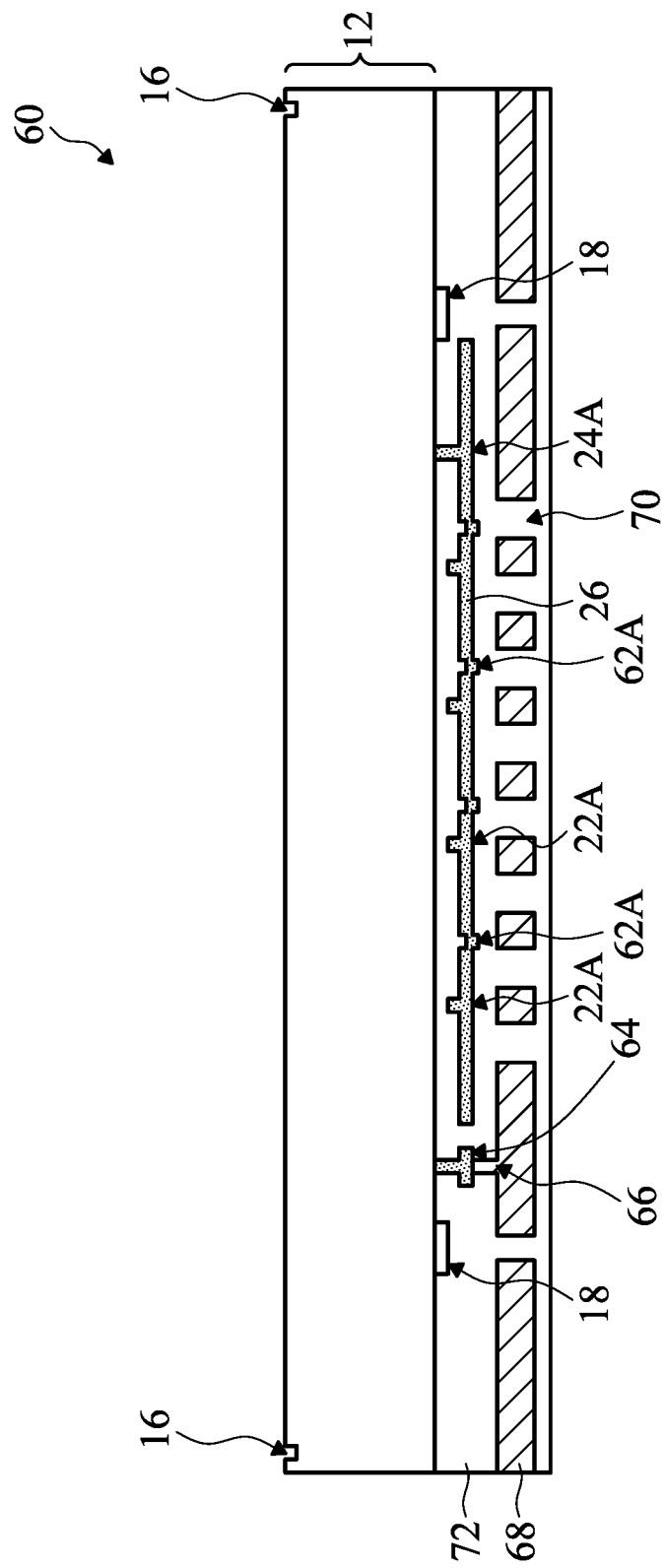

Referring to FIG. 22, a thick silicon oxide layer is further formed on the silicon oxide layer 28 and back plate 68. The thick silicon oxide layer is thick enough to fill in the vias 70 and 71. The thick silicon oxide layer and the silicon oxide layer 28 are collectively referred to as silicon oxide layer 72. A CMP process is further applied the silicon oxide layer 72 for planarization. In one embodiment, the thick silicon oxide layer is deposited by CVD or other suitable technique, such as thermal oxidation, or a combination thereof.

Figure 23:
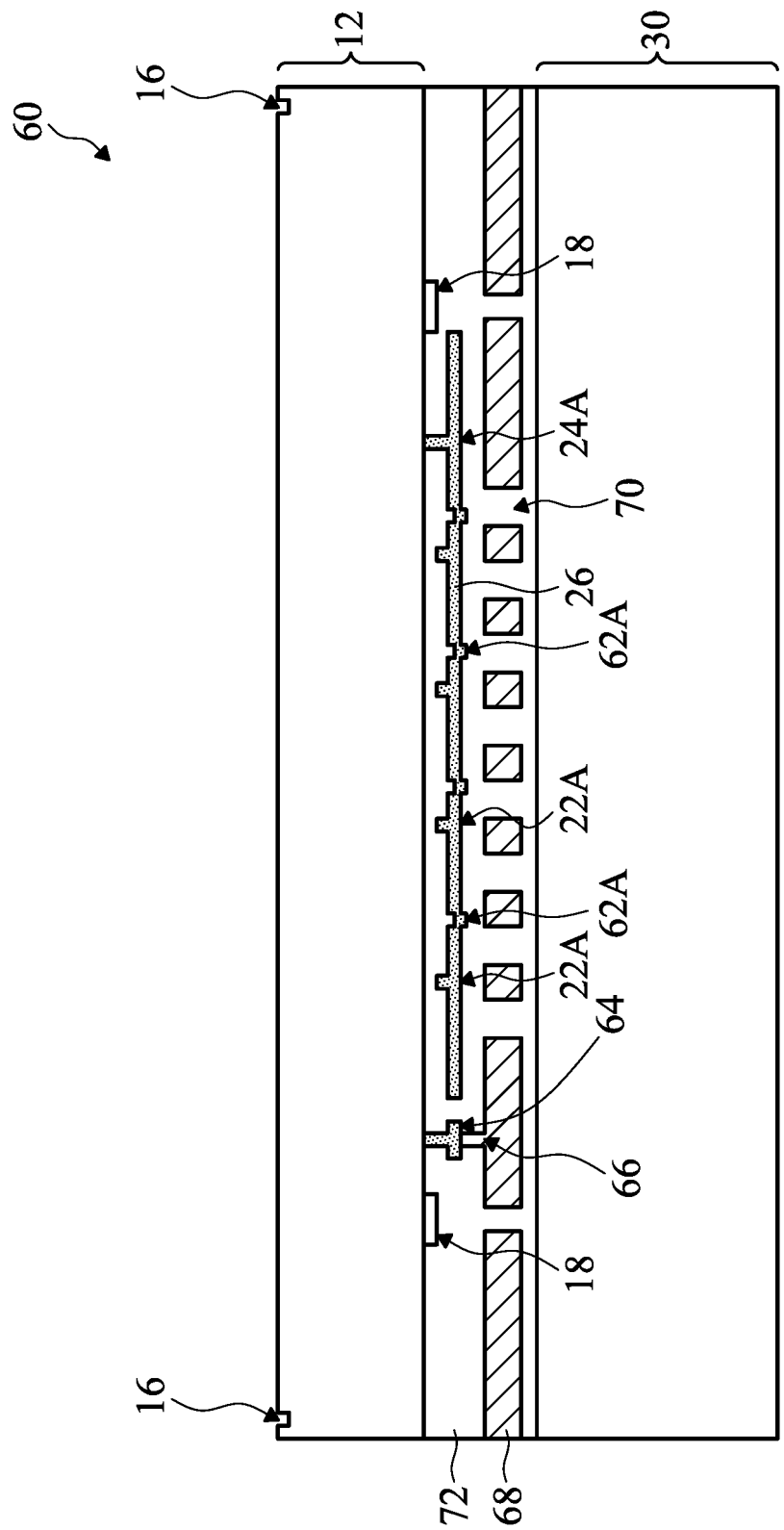

Referring to FIG. 23, a second substrate 30 as a carrier substrate is boned to the first substrate 12 through the silicon oxide layer 72. In the present embodiment, the second substrate 30 is a silicon substrate (such as a silicon wafer) and is bonded to the silicon oxide layer 72 by fusion bonding. In this example, the fusion bonding is between silicon and silicon oxide. The CMP process at the previous step provides a smooth and flat surface to enhance the bonding effect.

Figure 24:
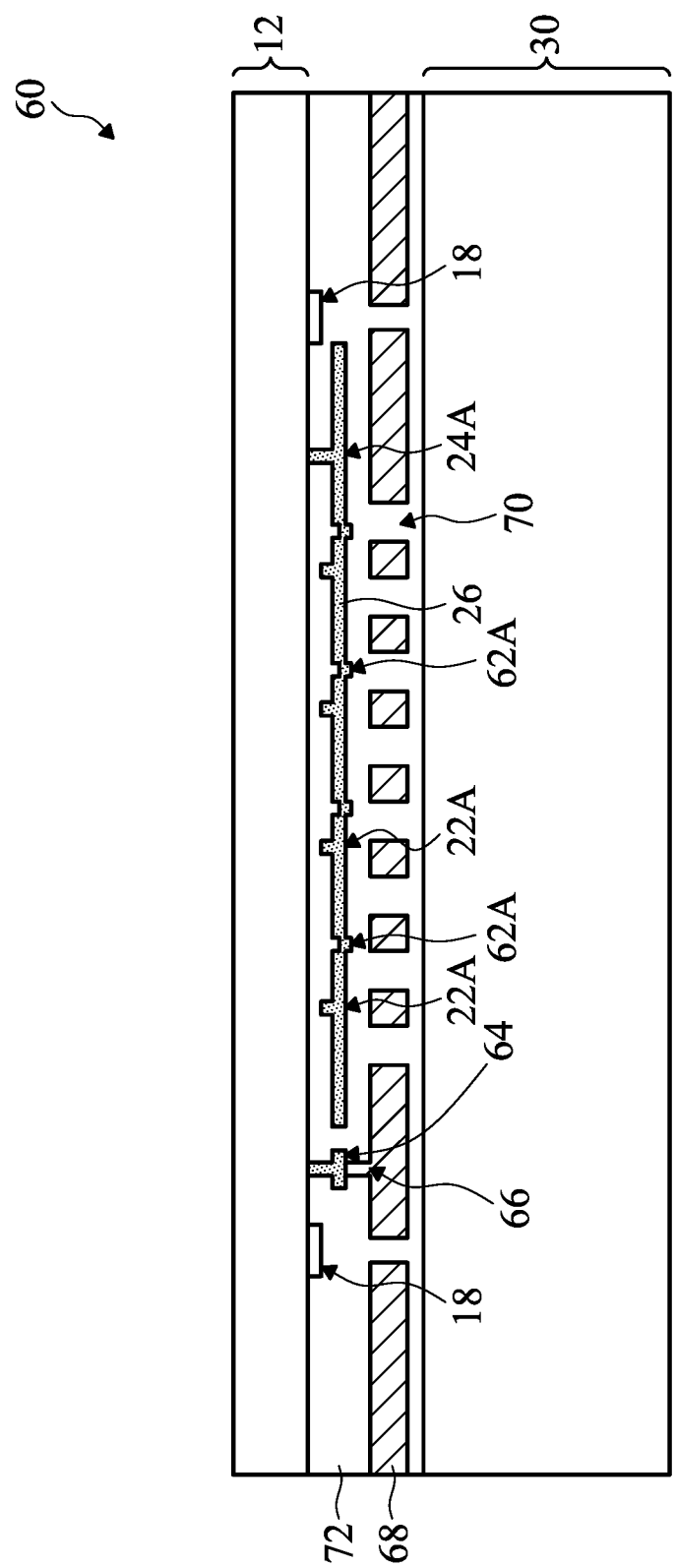

Referring to FIG. 24, a polishing process is applied to the first silicon substrate 12 from the first side (the backside) of the first silicon substrate to reduce the thickness thereof. In the present embodiment, after the polishing, the thickness of the first silicon substrate 12 is reduced to about 10 micron or less. In one embodiment, the polishing process includes CMP. In another embodiment, the polishing process may including grinding and then CMP.

Figure 25:
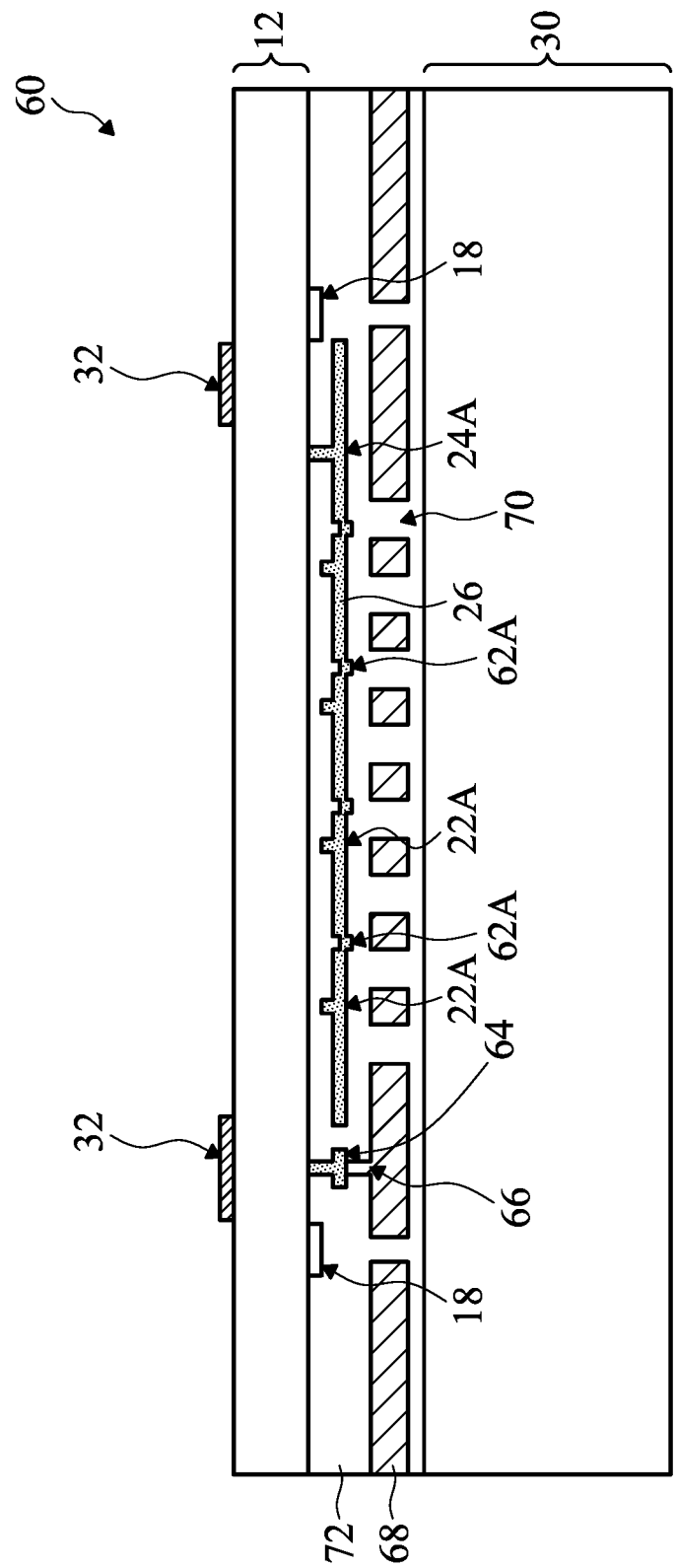

Referring to FIG. 25, metal pads 32 are formed on the backside of the first silicon substrate 12 for electrical routing (such as contact pads for diaphragm and plate). Especially, the metal pads 32 are formed on the polished surface. In one embodiment, the metal pads 32 include suitable metal or metal alloy, such as copper, aluminum, gold, silver or combination thereof. The formation of the metal pads 32 includes deposition and patterning. The deposition includes PVD or other suitable technique.

Figure 26:
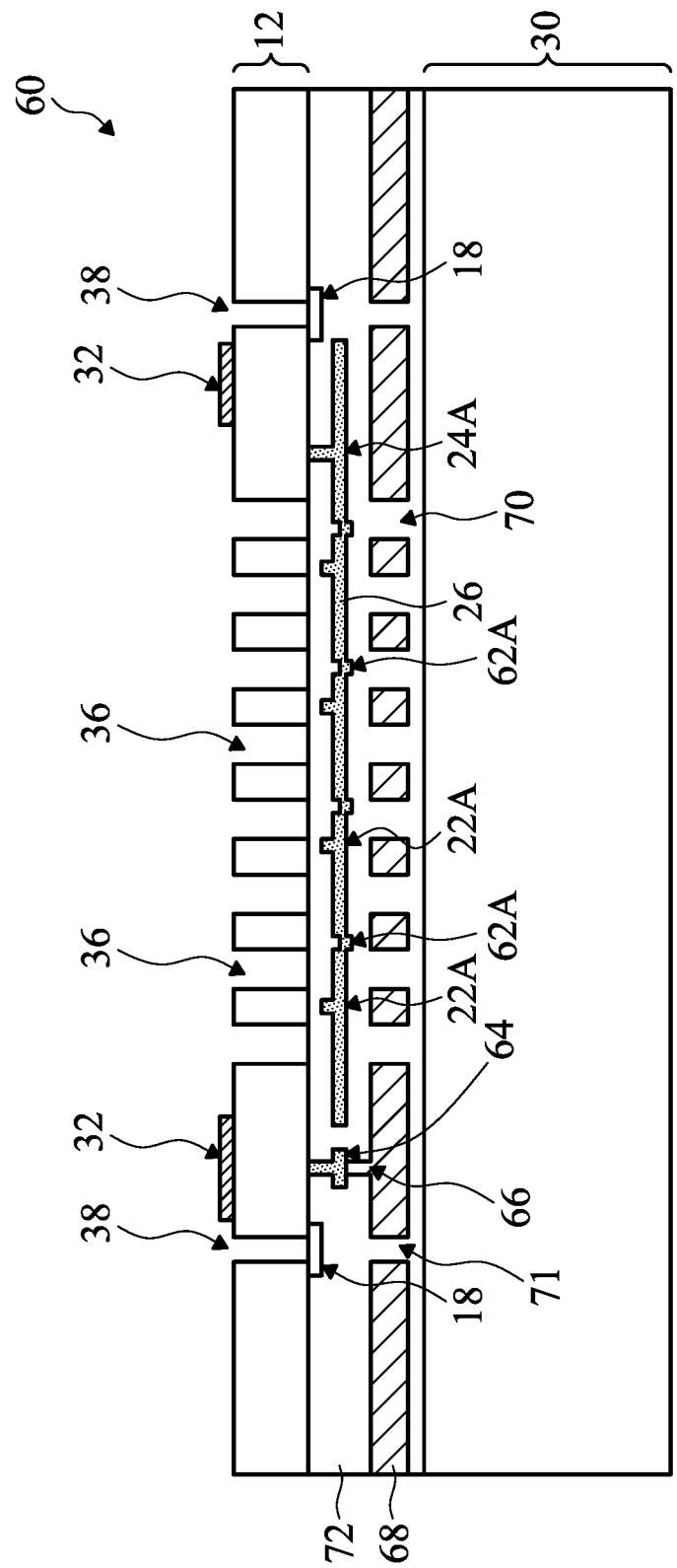

Referring to FIG. 26, a patterning process is applied to the first silicon substrate 12 to form a top plate of the integrated microphone unit. The top plate is also referred to as 12 in the following description. The patterning process forms a various trenches in the first silicon substrate 12, including trenches 36 and isolation trenches 38. The trenches 36 are through trenches such that the silicon oxide layer 72 is exposed within the trenches 36. The trenches 36 provide a path for acoustic wave to reach the diaphragm 26 during field application. The acoustic wave may approach the diaphragm from either top or bottom side, depending on packaging type. The trenches 36 also provide a path for silicon oxide etch to release the diaphragm at later fabrication stage. The isolation trenches 38 are configured on edges of the microphone unit for isolation purpose, such as isolating the microphone unit 34 from other circuit components. The isolation trenches 38 are aligned with the trench barrier 18 such that the first silicon substrate 12 is not exposed within the isolation trenches 38.

In one embodiment, the trenches 36 in the top plate are aligned with the vias 70 in the back plate to form patterns in both plates. In another embodiment, the trenches 38 in the top plate are aligned with the vias 71 in the back plate. In one example, the metal pads 32 are configured on the first silicon substrate 12 such that an isolation trench 38 is separated from the plurality of trenches 36 by a metal pad 32. The patterning process includes lithography process and etching.

Figure 27:
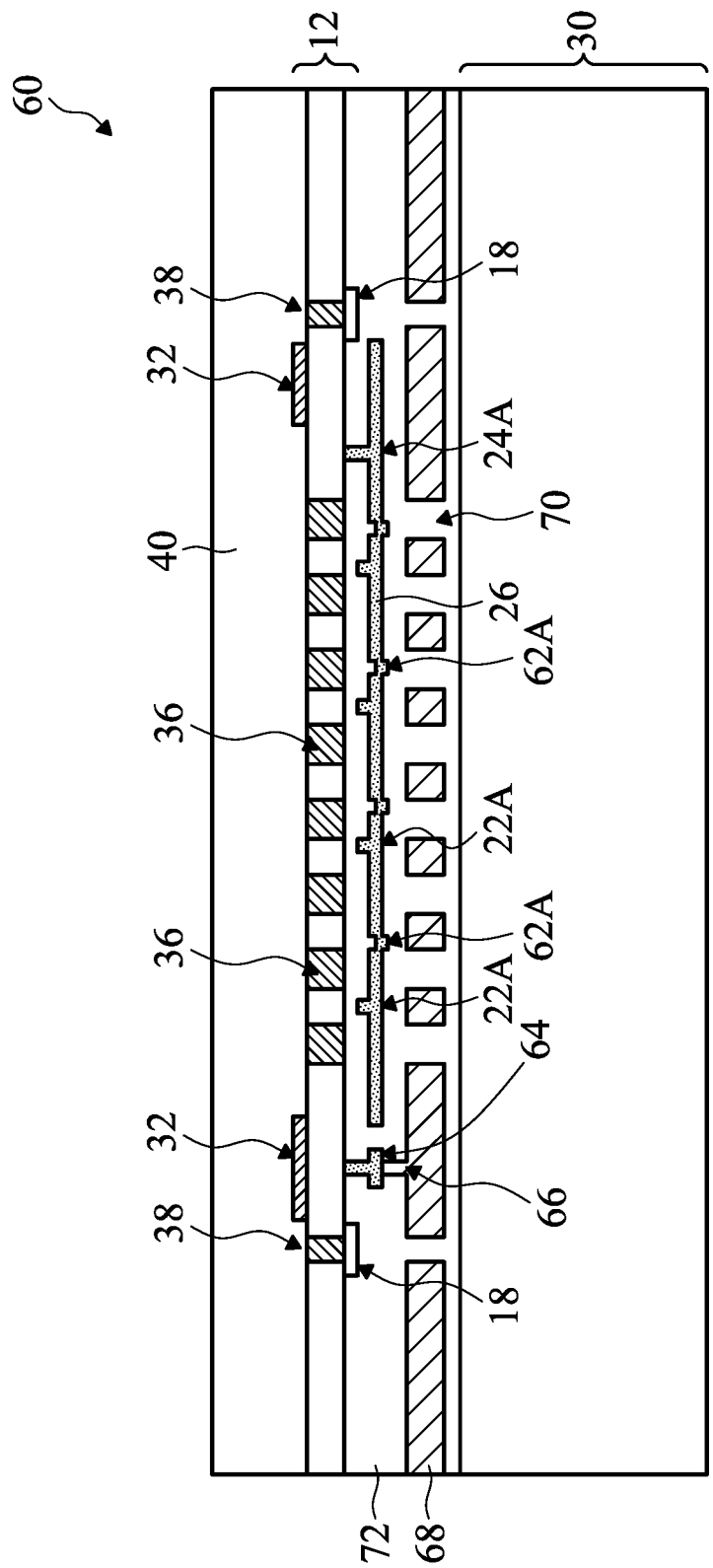

Referring to FIG. 27, a protection layer 40 is coated on the first silicon substrate 12 such that the top plate is protected from following etching. In the present embodiment, the protection layer 40 is a photoresist layer (resist layer) formed by spin-on coating.

Figure 28:
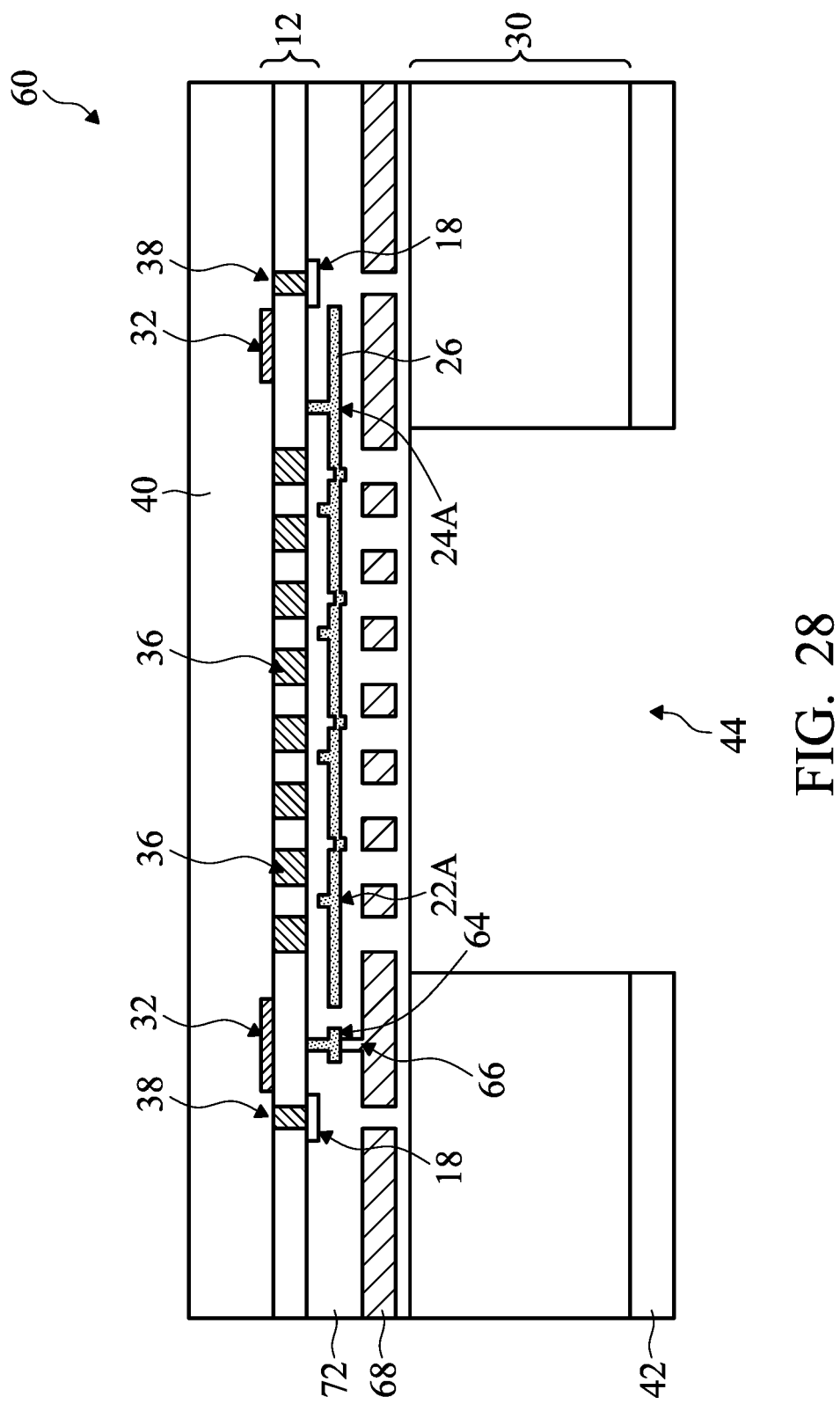

Referring to FIG. 28, a patterning process is applied to the second silicon substrate 30 to form a cavity 44 therein. The silicon oxide layer 72 is exposed within the cavity 44. The patterning process includes lithography process and etching process. Particularly, the lithography process forms a patterned resist layer 42 on the second substrate 30. The etching process selectively etches the second substrate 30 to form the cavity 44 using the patterned resist layer 42 as an etch mask. During the etching process, the first silicon substrate 12 is protected from the etching by the protection layer 40.

Figure 29:
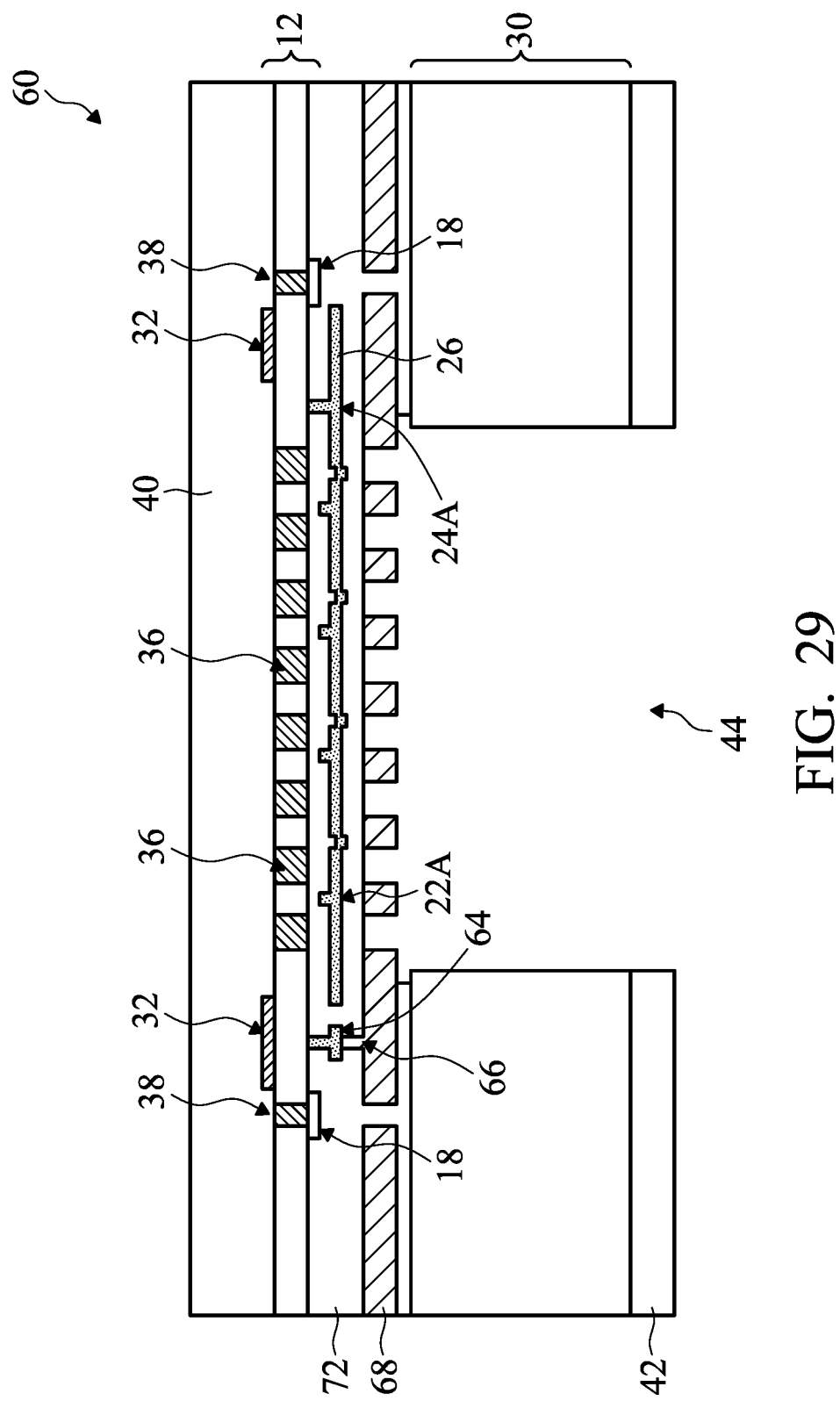

Referring to FIG. 29, an etching process may be applied to selectively etch the silicon oxide layer 72 from the second side through the cavity 44 to release the back plate. Only a portion of the silicon oxide layer 72 is removed in this etch process, which is designed to remove a portion of the silicon oxide layer 72 from the second side such that the silicon oxide layer 72 in both sides of the diaphragm 26 is substantially equal. In the present embodiment, the etching process is a wet etch using HF solution as the etchant.

Figure 30:
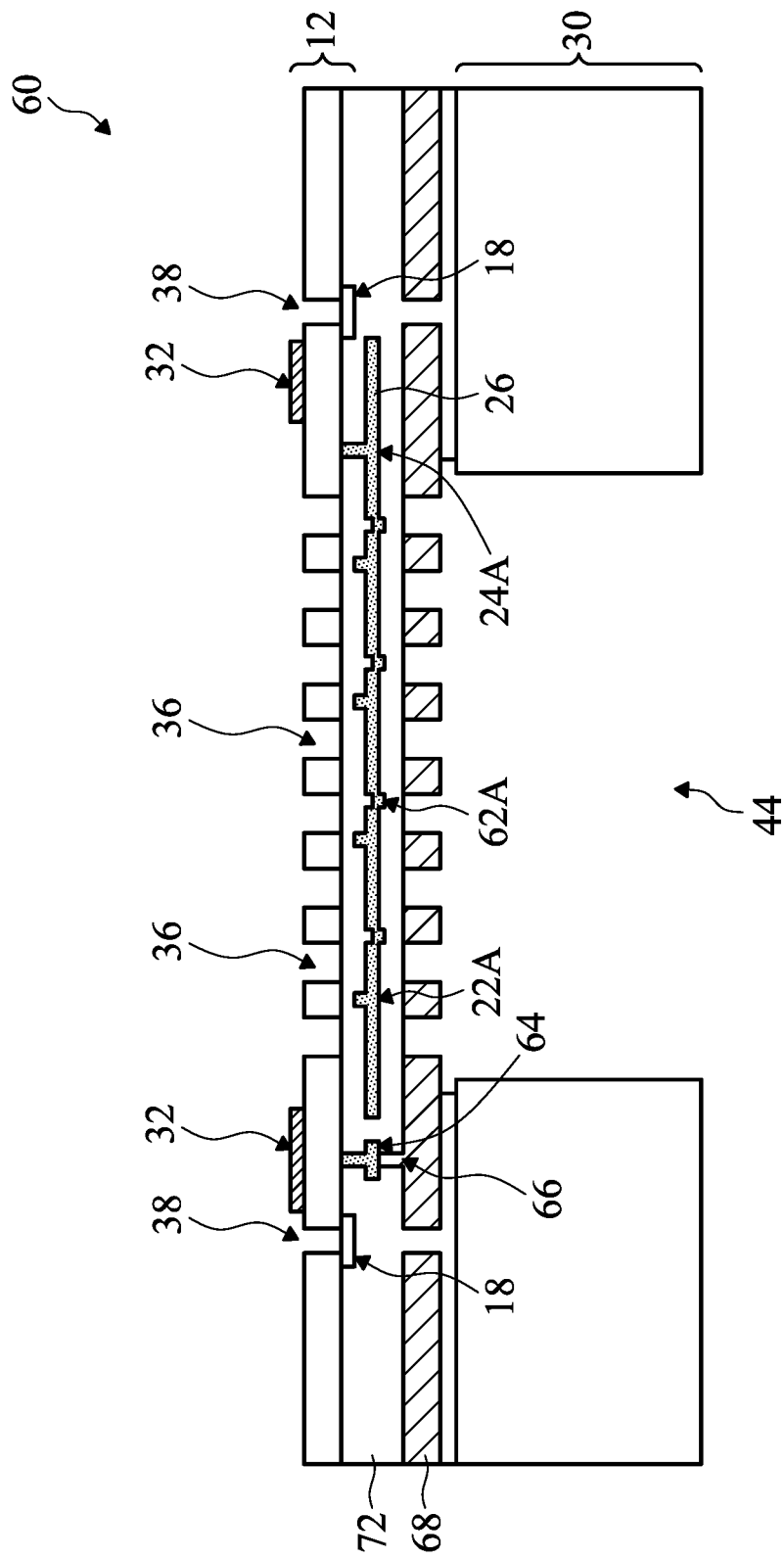

Referring to FIG. 30, the protection layer 40 (a resist layer in the present embodiment) and the patterned resist layer 42 are removed by a suitable technique, such as ashing or wet stripping. In one example, the resist layers 40 and 42 are removed simultaneously by one process, such as ashing from both sides (double side ashing).

Figure 31:
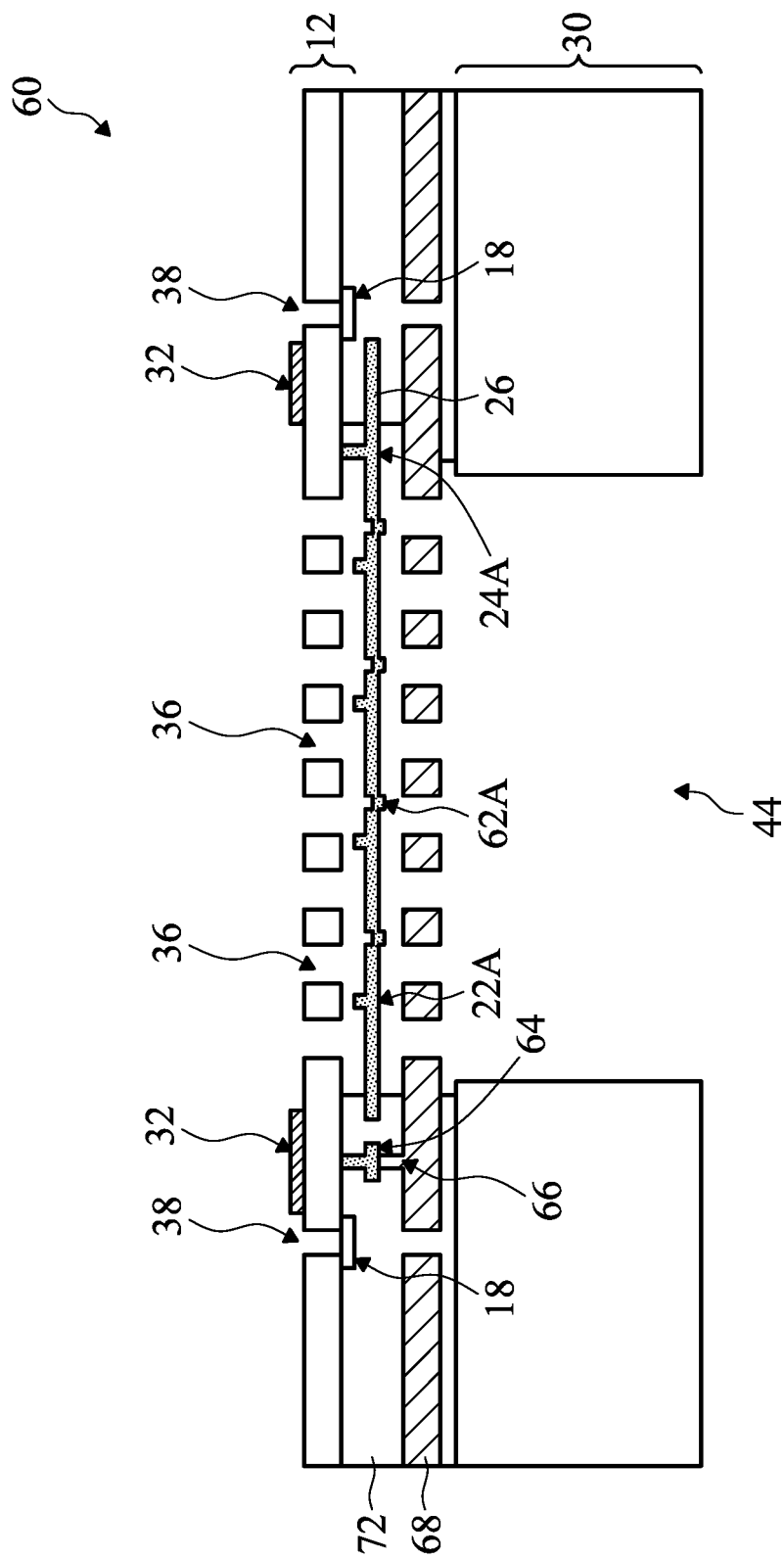

Referring to FIG. 31, an etching process is applied to selectively etch the silicon oxide layer 72 from the first side through the trenches 36 and the second side through the cavity 44. The isolation trenches 38 are blocked by the trenches barrier 18 so that the etching to the silicon oxide layer 72 through the isolation trenches 38 is eliminated. In the present embodiment, vapor HF is used as etchant to etch the silicon oxide layer 72. Thereby, the diaphragm 26 is released. Particularly, the diaphragm 26 is secured by the silicon oxide layer 28 but its central portion is movable in response to acoustic wave.

The top bumps 22A are designed to prevent the diaphragm 26 from sticking to the top plate 12 (the first silicon substrate 12). The bottom bumps 62A are designed to prevent the diaphragm 26 from sticking to the back plate plate 68. The diaphragm plug 24A is configured to provide electrical routing to the diaphragm 26. The conductive feature 64 is configured to provide electrical routing to the back plate through the via 66.

The formed microphone structure 60 includes the top plate 12, the diaphragm 26 and the back plate 68 configured to form a capacitive microphone. In one embodiment, the vias of the top plate 12 and the vias of the back plate 68 are designed to have same via pattern aligned with each other so the microphone structure 60 is symmetric.

Thus formed microphone structure 60 and the method making the same have various advantages in different embodiments. In one embodiment, using to silicon substrates bonded thorough silicon and silicon oxide by fusion bonding, the process is simple and cost effective. In another embodiment, the microphone structure with the double plates with symmetric signal is more sensitive to the acoustic signal. In another embodiment, the process flow of the method is compatible with and is easier to be integrated with other integrated circuit components, such as MEMS module or drive circuit.

The microphone structure and the method making the same are described according to various embodiments. Other alternatives may present without departure from the scope of the present disclosure. In one embodiment, the back plate 68 may be formed by another conductive material, such as metal or metal alloy. In another embodiment, the trench barrier 18 may include other dielectric material having an etch selectivity to the silicon oxide.

Thus, the present disclosure provides one embodiment of an integrated microphone structure. The integrated microphone structure includes a first silicon substrate patterned as a first plate; a silicon oxide layer formed on first side of the first silicon substrate; a second silicon substrate bonded to the first substrate through the silicon oxide layer such that the silicon oxide layer is sandwiched between the first and second silicon substrates; and a diaphragm secured on the silicon oxide layer and configured between the first and second silicon substrates, wherein the first plate and the diaphragm are configured to form a capacitive microphone.

In one embodiment of the integrated microphone structure, the first silicon substrate is heavily doped to have a resistivity between about 0.007 Ohm*cm and about 0.025 Ohm*cm.

In another embodiment, the diaphragm includes a conductive material. In yet another embodiment, the diaphragm includes a doped polysilicon material layer. In yet another embodiment, the diaphragm further includes bump features facing the first side of the first silicon substrate.

In one embodiment, the first silicon substrate has a plurality of through vias. In another embodiment, the first silicon substrate further includes isolation through-via for isolating the capacitive microphone from adjacent circuit components; and the silicon oxide layer includes capping feature aligned with the isolation through via.

In yet another embodiment, the integrated microphone structure further includes a second plate secured by the silicon oxide layer and configured between the diaphragm and the second silicon substrate, wherein the first plate, the diaphragm and the second plate are configured as a microphone.

In yet another embodiment, the diaphragm includes a first plurality of bump features formed a first side and a second plurality of bump features formed a second side. In yet another embodiment, the integrated microphone structure further includes a conductive feature embedded in the silicon oxide layer and configured to couple the second plate to the first silicon substrate. In yet another embodiment, the second plate includes doped polysilicon.

In yet another embodiment, the second plate includes a plurality of through vias configured to be aligned with the plurality of through vias of the first plate. In yet another embodiment, the second silicon substrate includes a cavity aligned with the diaphragm.

The present disclosure also provides another embodiment of an integrated microphone structure. The integrated microphone structure includes a first silicon substrate patterned as a first plate; a silicon oxide layer formed on first side of the first silicon substrate; a second silicon substrate bonded to the first substrate through the silicon oxide layer such that the silicon oxide layer is sandwiched between the first and second silicon substrates; a second plate secured by the silicon oxide layer and configured between the first and second silicon substrates; a diaphragm secured on the silicon oxide layer and configured between the first and second plates, wherein the first plate, the diaphragm and the second plate are configured to form a capacitive microphone.

In one embodiment, each of the diaphragm and the second plate includes doped polysilicon. In another embodiment, the diaphragm includes a first plurality of bump features formed a first side and a second plurality of bump features formed a second side; and the silicon oxide layer includes a conductive feature embedded therein and configured to provide electrical routing from the second plate to a metal pad formed on the first plate.

The present disclosure provides an embodiment of a method for manufacturing a microphone. The method includes forming a first silicon oxide layer on a first silicon substrate; forming a diaphragm on the first silicon oxide; forming a second silicon oxide layer on the diaphragm and the first silicon oxide layer; attaching a second silicon substrate to the first silicon substrate by fusion bonding; patterning the first silicon substrate to form a first plate with a first plurality of through vias; patterning the second silicon substrate to form a cavity in the second silicon substrate; and etching the first and second silicon oxide layer through the first plurality of vias of the first silicon substrate and the cavity of the second silicon substrate.

In one embodiment, the method further includes forming a second plate on the second silicon oxide layer; and forming a third silicon oxide layer on the second plate and the second silicon oxide layer, wherein the attaching the second silicon substrate includes attaching the second silicon substrate to the third silicon oxide layer by fusion bonding.

In another embodiment, the forming a second plate includes depositing a polysilicon layer on the second silicon oxide layer; and patterning the polysilicon layer to form a second plurality of vias. The etching the first and second silicon oxide layer includes etching the first, second and third silicon oxide layers through the first plurality of vias, the second plurality of vias and the cavity such that the diaphragm is exposed from both sides.

In yet another embodiment, the method further includes polishing the first silicon substrate prior to the patterning the first silicon substrate to form a first plate.

The present disclosure provides another embodiment of a method for manufacturing a microphone. The method includes forming a first silicon oxide layer on a first silicon substrate; forming trenches on the first silicon oxide layer; forming a through via in the first silicon oxide layer; depositing a polysilicon layer on the first silicon oxide layer and in the trenches and the through via; forming a second silicon oxide layer on the polysilicon layer; attaching a second silicon substrate to the second silicon oxide layer by fusion bonding; polishing the first silicon substrate; patterning the first silicon substrate to form a first plate have a plurality of vias; forming a cavity in the second silicon substrate; and etching a portion of the silicon oxide layer through the vias of the first silicon substrate and the cavity of the second silicon substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
    forming a first dielectric layer over a first semiconductor substrate;
    forming a diaphragm over the first dielectric layer;
    forming a second dielectric layer over the diaphragm;
    bonding a second semiconductor substrate to the first semiconductor substrate such that the first and second dielectric layers are disposed between the bonded first and second semiconductor substrates;
    forming a trench extending through the first semiconductor substrate;
    forming a cavity in the second semiconductor substrate; and
    removing a portion of the first dielectric layer through the trench and a portion of the second dielectric layer through the cavity.

2. The method of claim 1, wherein the first dielectric layer and the second dielectric layer are formed of the same material.

3. The method of claim 2, wherein the material includes an oxide material.

4. The method of claim 1, wherein after forming the trench extending through the first semiconductor substrate, a portion of the first dielectric layer is exposed within the trench.

5. The method of claim 1, further comprising:
    forming a protection layer within the trench prior to forming the cavity in the second semiconductor substrate; and
    removing the protection layer from within the trench prior to removing the portion of the first dielectric layer through the trench and the portion of the second dielectric layer through the cavity.

6. The method of claim 1, wherein bonding the second semiconductor substrate to the first semiconductor substrate includes performing a fusion bonding process.

7. The method of claim 1, wherein after removing the portion of the first dielectric layer through the trench and the portion of the second dielectric layer through the cavity, a portion of the diaphragm is suspended between the first and second semiconductor substrates.

8. A method for manufacturing a microphone, the method comprising:
    forming a first silicon oxide layer on a first silicon substrate;
    forming a diaphragm on the first silicon oxide layer;
    forming a second silicon oxide layer on the diaphragm and the first silicon oxide layer;
    attaching a second silicon substrate to the first silicon substrate by fusion bonding;
    patterning the first silicon substrate to form a first plate with a first plurality of vias;

patterning the second silicon substrate to form a cavity in the second silicon substrate; and etching the first and second silicon oxide layers through the first plurality of vias of the first silicon substrate and the cavity of the second silicon substrate.

9. The method of claim 8, further comprising:

forming a second plate on the second silicon oxide layer; and forming a third silicon oxide layer on the second plate and the second silicon oxide layer, wherein the attaching the second silicon substrate includes attaching the second silicon substrate to the third silicon oxide layer by fusion bonding.

10. The method of claim 9, wherein forming the second plate includes:

depositing a polysilicon layer on the second silicon oxide layer; and patterning the polysilicon layer to form a second plurality of vias, and wherein etching the first and second silicon oxide layers includes etching the first, second and third silicon oxide layers through the first plurality of vias, the second plurality of vias and the cavity such that the diaphragm is exposed from both sides.

11. The method of claim 8, further comprising polishing the first silicon substrate prior to the patterning the first silicon substrate to form the first plate.

12. The method of claim 8, further comprising planarizing the first silicon substrate after attaching the second silicon substrate to the first silicon substrate by fusion bonding.

13. The method of claim 12, further comprising forming metal pads on the first silicon substrate after planarizing the first silicon substrate.

14. A method comprising:

receiving a first substrate having a first dielectric layer disposed thereon;

forming a diaphragm on the first dielectric layer such that a first portion of the diaphragm extends through the first dielectric layer to couple to the first substrate;

forming a second dielectric layer on the diaphragm and on the first dielectric layer;

bonding a second substrate to the second dielectric layer; and patterning the first dielectric layer, the second dielectric layer, and the second substrate, such that a second portion of the diaphragm is exposed.

15. The method of claim 14 further comprising etching a plurality of trenches extending through the first substrate.

16. The method of claim 15, wherein the patterning of the first dielectric layer, the second dielectric layer, and the second substrate etches the first dielectric layer through the plurality of trenches extending through the first substrate.

17. The method of claim 15 further comprising forming a protection layer on the first substrate and within the plurality of trenches extending through the first substrate, wherein the protection layer is configured to protect the first substrate during the patterning of the second substrate.

18. The method of claim 14 further comprising etching a recess extending partially through the first dielectric layer, wherein the forming of the diaphragm on the first dielectric layer forms a protrusion of the diaphragm in the recess.

19. The method of claim 14 further comprising etching a trench extending through the first dielectric layer, wherein the forming of the diaphragm on the first dielectric layer forms the first portion of the diaphragm extending through the trench to couple to the first substrate.

20. The method of claim 14 further comprising forming a conductive feature on the first substrate opposite the first dielectric layer.

\* \* \* \* \*